(12) United States Patent
Chen

(10) Patent No.: US 10,230,027 B2
(45) Date of Patent: Mar. 12, 2019

(54) MOISTURE-RESISTANT CHIP SCALE PACKAGING LIGHT-EMITTING DEVICE

(71) Applicant: MAVEN OPTRONICS CO., LTD., Hsinchu (TW)

(72) Inventor: Chieh Chen, Palo Alto, CA (US)

(73) Assignee: MAVEN OPTRONICS CO., LTD., Hsinchu County (TW)

(*) Notice: Subject to any disclaimer, the term of this patent is extended or adjusted under 35 U.S.C. 154(b) by 0 days.

(21) Appl. No.: 15/665,280

(22) Filed: Jul. 31, 2017

(65) Prior Publication Data

US 2018/0040786 A1    Feb. 8, 2018

(30) Foreign Application Priority Data

Aug. 5, 2016  (TW) .............................. 105124965 A
Aug. 9, 2016  (CN) .......................... 2016 1 0648426

(51) Int. Cl.
*H01L 33/00* (2010.01)
*H01L 33/56* (2010.01)
(Continued)

(52) U.S. Cl.
CPC ............ *H01L 33/56* (2013.01); *H01L 33/504* (2013.01); *H01L 33/505* (2013.01);
(Continued)

(58) Field of Classification Search
CPC ..... H01L 33/56; H01L 33/504; H01L 33/505; H01L 33/507; H01L 33/54; H01L 33/60;
(Continued)

(56) References Cited

U.S. PATENT DOCUMENTS 7,344,902 B2 * 3/2008 Basin ................... H01L 24/97
257/E33.059
9,620,686 B2 * 4/2017 Steckel ................ H01L 33/501
(Continued)

FOREIGN PATENT DOCUMENTS

JP    2012-036265 A    2/2012
JP    2016-001735 A    1/2016
(Continued)

OTHER PUBLICATIONS

Office Action with Search Report in corresponding Taiwan Patent Application No. 105124965, dated Mar. 8, 2017, 3 pages.
(Continued)

*Primary Examiner* — Nikolay K Yushin
(74) *Attorney, Agent, or Firm* — Foley & Lardner LLP; Cliff Z. Liu

(57) ABSTRACT

A chip scale packaging (CSP) light-emitting device including a light-emitting semiconductor die and a layer-by-layer photoluminescent (PL) structure disposed on the light-emitting semiconductor die is disclosed. The PL structure includes a second PL layer and a first PL layer disposed over the second PL layer, wherein the first PL layer functions as a photoluminescent layer and a barrier layer protecting the second PL from ambient oxygen and moisture. The first PL layer includes a less-moisture-sensitive PL material dispersed within a first polymer matrix material, whereas the second PL layer includes a moisture-sensitive PL material dispersed within a second polymer material. With these arrangements, the outermost first PL layer comprising the less-moisture-sensitive photoluminescent material functions as a wavelength-conversion layer and also serves as a barrier layer protecting the inner second PL layer comprising the moisture-sensitive photoluminescent material from ambient
(Continued)

oxygen and moisture. Thus degradation of moisture-sensitive PL material can be reduced.

33 Claims, 19 Drawing Sheets

(51) Int. Cl.
*H01L 33/50* (2010.01)
*H01L 33/54* (2010.01)
*H01L 33/60* (2010.01)
H01L 33/36 (2010.01)
H01L 33/48 (2010.01)
H01L 33/44 (2010.01)

(52) U.S. Cl.
CPC ............ *H01L 33/507* (2013.01); *H01L 33/54* (2013.01); *H01L 33/60* (2013.01); *H01L 33/36* (2013.01); *H01L 33/44* (2013.01); *H01L 33/486* (2013.01); *H01L 33/501* (2013.01); *H01L 2933/005* (2013.01); *H01L 2933/0041* (2013.01); *H01L 2933/0058* (2013.01); *H01L 2933/0091* (2013.01)

(58) Field of Classification Search
CPC .................. H01L 33/36; H01L 33/486; H01L 2933/0041; H01L 2933/005; H01L 2933/0058; H01L 2933/0091
See application file for complete search history.

(56) References Cited

U.S. PATENT DOCUMENTS

| 9,660,151 | B2 | 5/2017 | Tamaki | |
|---|---|---|---|---|
| 9,803,822 | B1* | 10/2017 | Salter | F21S 43/33 |
| 2006/0022582 | A1 | 2/2006 | Radkov | |
| 2006/0105485 | A1* | 5/2006 | Basin | H01L 24/97 438/27 |
| 2007/0077594 | A1 | 4/2007 | Hikmet et al. | |
| 2009/0057699 | A1 | 3/2009 | Basin et al. | |
| 2010/0119839 | A1 | 5/2010 | Chen | |
| 2010/0142189 | A1 | 6/2010 | Hong et al. | |
| 2010/0320479 | A1 | 12/2010 | Minato et al. | |
| 2011/0156081 | A1 | 6/2011 | De Carvalho Esteves et al. | |
| 2012/0287381 | A1 | 11/2012 | Li et al. | |
| 2015/0179903 | A1* | 6/2015 | Pun | H01L 33/54 257/ |
| 2016/0218252 | A1* | 7/2016 | Steckel | H01L 33/501 |

FOREIGN PATENT DOCUMENTS

| KR | 2010-0091992 A | 8/2010 |
|---|---|---|
| KR | 2013-0017031 A | 2/2013 |
| TW | 200524193 A | 7/2005 |
| TW | 201022399 A | 6/2010 |
| TW | 201027807 A | 7/2010 |
| TW | 201341899 A | 10/2013 |
| TW | 201622171 A | 6/2016 |
| WO | WO-2010/106504 A1 | 9/2010 |
| WO | WO-2012/132236 A1 | 10/2012 |
| WO | WO-2012/156514 A1 | 11/2012 |
| WO | WO-2013/171610 A1 | 11/2013 |
| WO | WO-2015/121089 A1 | 8/2015 |

OTHER PUBLICATIONS

Extended Search Report for EP Patent Application No. 17183965.7, dated Nov. 21, 2017, 10 pages.
Office Action for corresponding Japanese Patent Application No. 2017-151954, dated Sep. 18, 2018, 6 pages.
Office Action for corresponding Korean Patent Application No. 10-2017-0097665, dated Jul. 19, 2018, 9 pages.

* cited by examiner

MOISTURE-RESISTANT CHIP SCALE PACKAGING LIGHT-EMITTING DEVICE

CROSS-REFERENCES TO RELATED APPLICATIONS

This application claims the benefit of and priority to Taiwan Patent Application No. 105124965 filed on Aug. 5, 2016, and Chinese Patent Application No. 201610648426.7 filed on Aug. 9, 2016, the disclosures of which are incorporated herein by reference in their entirety.

BACKGROUND

Technical Field

The present disclosure relates to a light-emitting device and, in particular, to an oxygen and moisture-resistant chip scale packaging light-emitting device including a light-emitting semiconductor die which generates electromagnetic radiation while it is in operation.

Description of the Related Art

Light-emitting devices (LEDs) are widely used in various applications such as general lightings, backlight units, traffic lights, portable devices, automotive lightings and so forth. Generally, a light-emitting semiconductor die is disposed inside a packaging structure, such as a lead frame, to form a packaged LED. Photoluminescent materials may further be included inside the packaging structure to partially convert a primary light (e.g., blue light) emitted from the light-emitting semiconductor die into a secondary light with longer wavelength (e.g., yellow light) so that the light comprised of different wavelengths is mixed together to generate a white light. To meet the specifications in various lighting applications, different photoluminescent materials with suitable specification in spectrum are desirable.

For example, a liquid crystal display (LCD) typically uses an LED as a backlight source. In this application, the emission spectrum of a photoluminescent material having a narrower Full Width at Half Maximum (FWHM) can improve color purity and allow a wider color gamut of the LCD to provide more vivid color images. Moreover, for general lighting applications, when a red photoluminescent material having a narrow FWHM of the emission spectrum is used in an LED, the Color Rendering Index (CRI) of the light can be substantially improved without excessively sacrificing its light conversion efficiency by down conversion of a minimum amount of the primary light. Thus, the LED can simultaneously possess a high CRI as well as a good luminous efficacy.

Currently, there are several photoluminescent materials specified to provide light spectrum with narrower FWHM, such as fluoride photoluminescent materials or semiconductor nano-crystal materials (e.g., quantum dots). However, these photoluminescent materials are susceptible to oxygen or moisture. For example, a fluoride photoluminescent material includes highly reactive transition metal ion activators (e.g., Manganese, $Mn^{4+}$), which may be oxidized when it is exposed to oxygen or moisture permeated from the ambient environment. The oxidized activator will cause the photoluminescent materials to become de-activated so that these photoluminescent materials gradually lose the capability of wavelength conversion, and thus gradually degrade the specified brightness or causing color spectrum shifting during its specified operation lifetime. As a result, several approaches are proposed by the LED industry to reduce the impact of oxygen or moisture to these moisture-sensitive photoluminescent materials.

For example, one approach involves a fluoride phosphor material activated by Manganese having a protective encapsulation layer formed on the outer surface of each phosphor particle. This encapsulation layer is a Manganese-free fluoride phosphor material to reduce the degradation mechanism induced by oxygen or moisture. In a further approach, another fluoride phosphor material is proposed to address the degradation issue, wherein a phosphor particle comprises an inner region and an outer surface region to encapsulate the inner region, and the concentration of Manganese in the surface region is lower than that in the inner region. Both approaches address the issue of material degradation induced by oxygen or moisture by minimizing exposure of Manganese to oxygen or moisture. The above solutions may slow down the degradation process of the fluoride photoluminescent material caused by oxygen or moisture; however, this degradation still cannot be completely avoided. Also, it is quite difficult to completely cover each of fluoride photoluminescent material particles with Manganese-free or with low-concentration Manganese layers, which will also increase phosphor fabrication cost. Besides, the presence of the encapsulation layer will also decrease the light conversion efficiency of fluoride photoluminescent materials.

Quantum dots (QDs) generally refer to small semiconductor crystals of II-IV, III-V, IV-VI, or IV materials having a size (e.g., diameter) on the order of about 1 nm to about 50 nm and can be used as photoluminescent materials with very narrow FWHM spectra. However, excessive defects and dangling bonds on the surface of the QDs may lead to non-radiative electron-hole recombinations causing relatively low quantum efficiency. Moreover, the surface of QDs tends to be oxidized due to photochemical reaction when the QDs come into contact with oxygen or moisture. To fabricate QDs with higher emission efficiency and stability, another inorganic semiconductor shell is created onto the QD core to form a core/shell structure. In this arrangement, the shell is considered as a protection layer to increase the emission efficiency by reducing the surface defects, and to improve the material stability by minimizing the photochemical reactions on the surface of QDs. Therefore, the core/shell QDs can have higher photoluminescent efficiency and more stability against photochemical oxidation. However, similar to fluoride phosphor materials, degradation of QDs can be slowed down by using the core/shell structure, but cannot be completely avoided.

Other solutions have been proposed to improve the stability of an LED by improving the packaging structure of the LED to minimize the oxidation process of the fluoride photoluminescent material with transition metal activators. For example, in one approach, a lead-frame-type LED device is proposed as comprising a transparent silicone encapsulant layer disposed on top of the phosphor-silicone slurry layer. If the LED package is not covered by the protective encapsulant layer, oxygen or moisture can readily permeate through the LED package to react with the phosphor materials. Thus the transparent silicone encapsulant layer functions as a barrier layer to reduce penetration of the ambient oxygen and moisture. In a further approach, another lead-frame-type LED device is proposed, wherein a phosphor material dispersed in silicone material is disposed in an optical cavity formed by a lead frame. In this approach, a higher weight percentage ratio of silicone relative to the phosphor slurry is specified, so that there is more amount of silicone to provide better oxygen/moisture resistance capability. Therefore the oxygen/moisture-induced degradation can be reduced accordingly.

It will be appreciated that the above solutions to reduce penetration of oxygen and moisture on the package level are developed for lead-frame-type LEDs. However, using the lead frame as an enclosure or housing will increase the package size of the LED. Moreover using a thicker silicone over-layer or more amount of silicone to improve the barrier property will further enlarge the overall size of the LED. Therefore, such solutions are unfavorable for some electronic products embedded with the LEDs, because these electronic products continue moving toward thinner and more compact in size, such as LED backlights for portable electronic devices or LED TVs. In order to meet the stringent physical space specifications, LEDs are desirable to be fabricated in a compact size. Accordingly, a chip scale packaging (CSP) LED has the advantage in size over other LED packages and thus attracts more and more attention in the LED industry. However, a size constraint of the LED makes it even more difficult to prevent external oxygen and moisture from penetrating into an LED package.

Therefore, there is a need to provide a compact CSP LED using moisture-sensitive photoluminescent materials to improve its optical properties, while maintaining good barrier properties to external oxygen and moisture during its specified operational lifetime.

SUMMARY

One object according to some embodiments of the present disclosure is to provide light-emitting devices specified with moisture barrier structures to prevent or minimize oxygen and moisture from contacting moisture-sensitive photoluminescent materials used inside the light-emitting devices. Desirably, the embodiments of the moisture barrier structures do not significantly increase a package size of a light-emitting device, so that a chip scale packaging light-emitting device maintains the advantage of a small form factor.

To achieve the aforementioned object, a light-emitting device according to some embodiments of the present disclosure comprises: a light-emitting semiconductor die, a layer-by-layer photoluminescent structure disposed on the light-emitting semiconductor die, and a reflective structure surrounding an edge surface of the light-emitting semiconductor die and an edge surface of the photoluminescent structure. The photoluminescent structure includes a second photoluminescent layer, and a first photoluminescent layer disposed on the second photoluminescent layer. The first photoluminescent layer comprises a first photoluminescent material (e.g., a less-moisture-sensitive photoluminescent material) dispersed within a first polymer matrix material, whereas the second photoluminescent layer comprises a second photoluminescent material (e.g., a moisture-sensitive photoluminescent material) dispersed within a second polymer matrix material. The reflective structure includes light scattering particles (e.g., non-moisture-sensitive light scattering particles) dispersed within a third polymer matrix material.

To achieve the aforementioned object, a light-emitting device according to other embodiments of the present disclosure comprises: a light-emitting semiconductor die, a layer-by-layer photoluminescent structure disposed on the light-emitting semiconductor die, and an encapsulation structure disposed covering the photoluminescent structure. The photoluminescent structure includes a second photoluminescent layer and a first photoluminescent layer covering the second photoluminescent layer. The first photoluminescent layer comprises a first photoluminescent material (e.g., a less-moisture-sensitive photoluminescent material) dispersed within a first polymer matrix material, whereas the second photoluminescent layer comprises a second photoluminescent material (e.g., a moisture-sensitive photoluminescent material) dispersed within a second polymer matrix material. The encapsulation structure includes a substantially transparent third polymer material.

To achieve the aforementioned object, a light-emitting device encapsulated using a lead frame or a submount substrate is embodied with a moisture-resistant layer-by-layer photoluminescent structure according to other embodiments of the present disclosure and comprises: a light-emitting semiconductor die, a packaging structure, and a photoluminescent structure. The packaging structure includes a lead frame or a submount substrate and a reflector partially covering the lead frame to form an optical cavity. The light-emitting semiconductor die disposed inside the optical cavity is mechanically bonded and electrically connected to electrodes of the lead frame. The photoluminescent structure disposed over the light-emitting semiconductor die yet inside the optical cavity includes a second photoluminescent layer and a first photoluminescent layer disposed on the second photoluminescent layer. The first photoluminescent layer includes a first photoluminescent material (e.g., a less-moisture-sensitive photoluminescent material) dispersed within a first polymer matrix material, whereas the second photoluminescent layer includes a second photoluminescent material (e.g., a moisture-sensitive photoluminescent material) dispersed within a second polymer matrix material.

Therefore, the present disclosure provides at least the following technical advantages according to some embodiments. The first photoluminescent layer comprising the less-moisture-sensitive photoluminescent material functions as a barrier layer protecting the underneath second photoluminescent layer comprising the moisture-sensitive photoluminescent material from the ambient oxygen and moisture. The reflective structure, the encapsulation structure, and the packaging structure can also prevent outside oxygen and moisture from permeating inside so that the degradation process of the moisture-sensitive photoluminescent material is significantly reduced. In other words, the less-moisture-sensitive photoluminescent layer functions as a light-conversion layer as well as a protective barrier layer for the underneath moisture-sensitive photoluminescent layer.

Specifically, in the first photoluminescent layer, both the first polymer matrix material and the less-moisture-sensitive photoluminescent material are specified to reduce or minimize permeation of ambient oxygen and moisture. Thus, without significantly increasing the package thickness, the first photoluminescent layer serves the purpose of an oxygen and moisture barrier layer to protect the underneath second moisture-sensitive photoluminescent layer comprising the moisture-sensitive photoluminescent material. As a result, the overall package size of the light-emitting device embodied with the moisture-resistant structure is minimized to meet the specification of a small form factor.

Furthermore, the light-emitting device may further include a getter layer comprising a getter material functioning together with the moisture-resistant structure as oxygen and moisture scavengers, which further inhibits the external oxygen and moisture from contacting the moisture-sensitive photoluminescent material.

Other aspects and embodiments of the disclosure are also contemplated. The foregoing summary and the following detailed description are not meant to restrict the disclosure to any particular embodiment but are merely meant to describe some embodiments of the disclosure.

DETAILED DESCRIPTION

Definitions

Figure 1A:
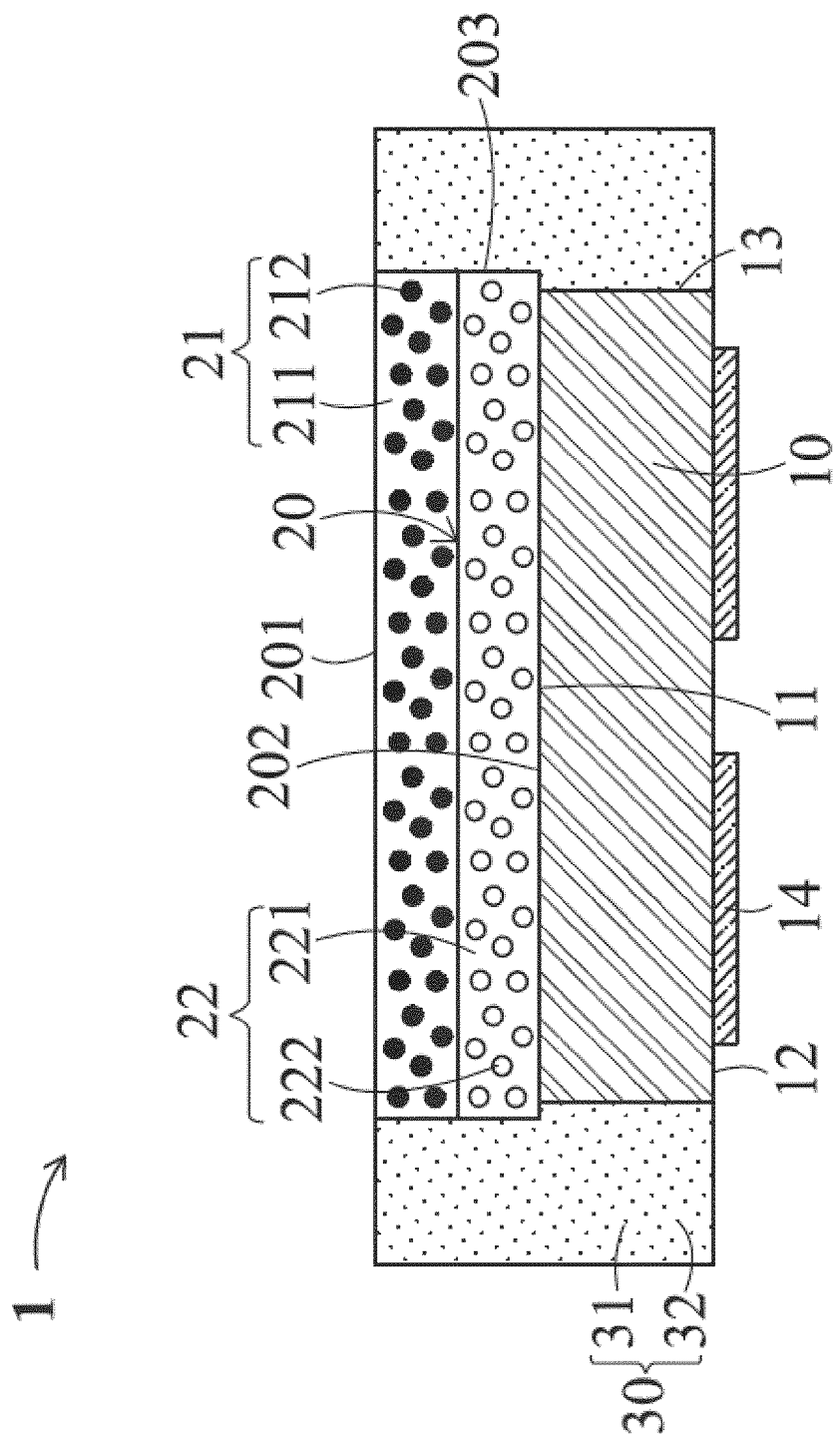
FIG. 1A, FIG. 1B, FIG. 1C, and FIG. 1D are schematic drawings in a cross-sectional view depicting LEDs according to some embodiments of the present disclosure.

The following definitions apply to some of the technical aspects described with respect to some embodiments of the invention. These definitions may likewise be expanded upon herein.

As used herein, the singular terms "a," "an," and "the" include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" transparent can refer to a light transmittance of at least 70%, such as at least 75%, at least 80%, at least 85% or at least 90%, over at least a portion or over an entirety of the visible spectrum.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

FIG. 1A shows a schematic drawing in a cross-sectional view of a light-emitting device (LED) 1 according to some embodiments of the present disclosure. The LED 1 includes a light-emitting semiconductor die 10, a photoluminescent structure 20, and a reflective structure 30. The technical contents are described as follows.

The light-emitting semiconductor die 10 is desirably a flip-chip type light-emitting semiconductor die having an upper surface 11, a lower surface 12, an edge surface 13, and a set of electrodes 14. The upper surface 11 and the lower surface 12 are formed substantially in parallel, facing opposite to each other. The edge surface 13 is formed and extends between the upper surface 11 and the lower surface 12, connecting an outer rim of the upper surface 11 with that of the lower surface 12.

The set of electrodes 14, or a plurality of electrodes, is disposed on the lower surface 12. Electricity is connected to the light-emitting semiconductor die 10 through the set of electrodes 14 so that electro-luminescence is generated and a primary light, such as a blue light or an ultraviolet (UV) light, is emitted outwardly. A majority of the light generated by the light-emitting semiconductor die 10 is radiated outwardly through the upper surface 11 and the edge surface 13.

The photoluminescent structure 20 may absorb a portion of the primary light (e.g., blue light or UV light) emitted from the light-emitting semiconductor die 10 and radiate as a secondary light having a longer wavelength (e.g., red, yellow, green or blue). Some of the primary light passing through the photoluminescent structure 20 is mixed with the secondary light(s) converted by the photoluminescent structure 20 to generate a light having a desired color appearance, such as a white light with a specified Correlated Color Temperature (CCT).

From the device structure perspective, the layer-by-layer photoluminescent structure 20 (hereinafter abbreviated as PL structure 20) includes an upper surface 201, a lower surface 202 and an edge surface 203. The upper surface 201 and the lower surface 202 are disposed facing oppositely to each other, and the edge surface 203 is formed between the upper surface 201 and the lower surface 202, connecting an outer rim of the upper surface 201 with that of the lower surface 202.

The PL structure 20 is disposed on the light-emitting semiconductor die 10. Specifically, the lower surface 202 of the PL structure 20 adjoins the upper surface 11 of the light-emitting semiconductor die 10 so that the lower surface 202 covers the upper surface 11. In other embodiments, the lower surface 202 is spaced apart from the upper surface 11, where a spacer or other structures (not shown) may be disposed between the PL structure 20 and the light-emitting semiconductor die 10. In addition, the size of lower surface 202 is desirably slightly larger than that of the upper surface 11, but this technical feature may be omitted or varied for other forms of embodiments. More specifically, the PL structure 20 includes a first photoluminescent layer (hereinafter abbreviated as first PL layer) 21 and a second photoluminescent layer (hereinafter abbreviated as second PL layer) 22, and the first PL layer 21 is disposed on the second PL layer 22. The first PL layer 21 may be stacked adjoining the second PL layer 22, or may be spaced apart from the second PL layer 22 to allow a spacer or other structures to be disposed in between.

The first PL layer 21 may include a first polymer matrix material 211 and a first photoluminescent material 212 (e.g., a less-moisture-sensitive photoluminescent material) (hereinafter abbreviated as less-moisture-sensitive PL material 212). The less-moisture-sensitive PL material 212 is dispersed within the first polymer matrix material 211. After being irradiated by the primary light (e.g., UV light) emitted from the light-emitting semiconductor die 10, the less-moisture-sensitive PL material 212 may generate the secondary light having a longer wavelength (e.g., red, green or blue light). If the less-moisture-sensitive PL material 212 includes a phosphor material, the material generally comprises metal activators less susceptible to oxygen or moisture. Therefore, the less-moisture-sensitive PL material 212 is less likely to be de-activated due to oxidation under the attack of oxygen or moisture. In other words, the less-moisture-sensitive material 212 can maintain desirable light-converting performance with specified light brightness and desirable light spectrum under the presence of oxygen and moisture, and thus are less susceptible to ambient environment. Examples of the less-moisture-sensitive material 212 include, but are not limited to, inorganic phosphor materials, such as Yttrium Aluminum Garnet (YAG) as a yellow phosphor material, Nitride phosphor materials or Oxynitride phosphor materials, such as β-SiAlON as a green phosphor material.

Since it is less susceptible to oxygen and moisture, the less-moisture-sensitive PL material 212 may be fabricated as a barrier layer to resist penetration of ambient oxygen or moisture. Table 1 shows the measurement results of the water vapor transmission rate (WVTR) of two layers with the same thickness of 2 mm. As for Film A, which is composed solely of a silicone material, the WVTR is 10.51 g/m²/day. As for Film B, which is composed of a silicone material and a less-moisture-sensitive photoluminescent material dispersed inside the silicone material with a weight percentage (wt. %) of 60%, the WVTR is reduced to 8.31 g/m²/day. As clearly evidenced, the first PL layer 21 has a lower WVTR and thus a better moisture-resistant barrier property when the less-moisture-sensitive PL material 212 is included inside the first polymer matrix material 211.

TABLE 1

WVTR measurement results of silicone thin films

| | Film A | Film B |
|---|---|---|
| Composition | Silicone | YAG Phosphor (60 wt. %) dispersed within silicone |
| Water Vapor Transmission Rate (g/m²/day) | 10.51 | 8.31 |

When the weight percentage of the less-moisture-sensitive PL material 212 is increased to form a higher packing density layer structure, the first PL layer 21 can have better oxygen and moisture barrier properties. This result is due to the fact that the WVTR of inorganic materials are generally several orders lower than that of organic polymer materials. Thus, desirably, the weight percentage of the less-moisture-sensitive PL material 212 relative to a total weight of the first PL layer 21 is not less than about 50%, not less than about 60%, or not less than about 70%. In order to achieve a higher packing density of the less-moisture-sensitive PL material 212, a medium particle size (D50) of phosphor particles of the less-moisture-sensitive PL material 212 is desirably not more than about 30 μm, not more than about 20 μm, or not more than about 10 μm.

Furthermore, both the less-moisture-sensitive PL material 212 and the first polymer matrix material 211 may serve to resist penetration of ambient oxygen or moisture. The first polymer matrix material 211 may be selected from polymer materials having a lower WVTR, for example, not more than about 10 g/m²/day measured at 2-mm layer thickness, to increase the moisture barrier property. Examples of the first polymer matrix material 211 include, but are not limited to, a resin material such as a silicone material.

As a result, the first PL layer 21 comprising the first polymer matrix material 211 and the less-moisture-sensitive PL material 212 can serve as an oxygen and moisture barrier layer to resist penetration of moisture, thus minimizing or reducing the risk of exposure of the second PL layer 22 to the ambient oxygen or moisture. The second PL layer 22 may include a second polymer matrix material 221 and a different, second photoluminescent material 222 (e.g., a moisture-sensitive photoluminescent material) (hereinafter abbreviated as moisture-sensitive PL material 222). The moisture-sensitive PL material 222 is dispersed and securely fixed within the second polymer matrix material 221. While being irradiated by the primary light (e.g., UV light) emitted from the light-emitting semiconductor die 10, the moisture-sensitive PL material 222 may desirably generate the secondary light having a longer wavelength with narrow FWHM (e.g., red, green, or blue light). The moisture-sensitive PL material 222 may be characterized by photoluminescence having a narrower FWHM compared to photoluminescence of the less-moisture-sensitive PL material 212.

Examples of the moisture-sensitive PL material 222 include phosphor materials activated with reactive metals, which tends to be oxidized under the presence of oxygen or moisture. Other examples of the moisture-sensitive PL material 222 include Silicate phosphor materials, which are more likely to be hydrolyzed with the presence of moisture and show less stability in comparison with YAG phosphor materials. Other examples of the moisture-sensitive PL material 222 include semiconductor nano-crystal materials (e.g., quantum dots). Quantum dots can be photoluminescent materials emitting specific spectra if irradiated by a higher energy primary light. The spectrum of the emitted light can be precisely tuned by changing the particle size, shape and material composition of quantum dots. However, irradiation of the quantum dots under the presence of oxygen or moisture may cause a significant decrease in the photoluminescence intensity due to photo-oxidation. Furthermore, photo-oxidation of quantum dots may cause the spectrum of emitted light to shift toward shorter wavelength spectrum, namely "blue shifting" of the photoluminescence spectrum.

Therefore, oxygen or moisture may cause the moisture-sensitive PL material 222 to lose the specified wavelength-converting performance. Thus the specified photoluminescent intensity, or spectrum shifting is gradually degraded during their specified operation lifetime. To reduce the amount of oxygen or moisture reaching the moisture-sensitive material 222, the first PL layer 21 is specified to serve as a barrier layer resisting penetration and permeation of ambient oxygen or moisture. Thus, the operation lifetime of the underneath moisture-sensitive material 222 is extended. Furthermore, the second polymer matrix material 221 may also be selected from polymer materials with a lower WVTR (e.g., a resin material such as a silicone material with a low WVTR), which may further reduce the amount of oxygen or moisture reaching the moisture-sensitive PL material 222.

In some embodiments, an example of the moisture-sensitive material 222 may include a red fluoride phosphor material, which comprises at least one of: (A) $A_2[MF_6]:M^{4+}$, wherein A is selected from Li, Na, K, Rb, Cs, $NH_4$, and combinations of two or more thereof; and where M is selected from Ge, Si, Sn, Ti, Zr, and combinations of two or more thereof; (B) $E[MF_6]:M^{4+}$, where E is selected from Mg, Ca, Sr, Ba, Zn, and combinations of two or more thereof; and where M is selected from Ge, Si, Sn, Ti, Zr, and combinations of two or more thereof (C) $Ba_{0.65}Zr_{0.35}F_{2.70}:M^{4+}$; or (D) $A_3[ZrF_7]:M^{4+}$, wherein A is selected from Li, Na, K, Rb, Cs, $NH_4$, and combinations of two or more thereof.

Another example of the moisture-sensitive material 222 includes quantum dots, which may be selected from, but not limited to, semiconductor nano-crystal materials of II-VI group compounds, III-V group compounds, IV-VI group compounds, and IV group compounds. For example, the II-VI group compounds may include CdS, CdSe, CdTe, ZnS, ZnSe, ZnTe, HgS, HgSe, HgTe, CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, HgZnSTe, and so forth; the III-V group compounds may include AlN, AlP, AlAs, AlSb, GaN, GaP, GaAs, GaSb, InN, InP, InAs, InSb, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and so forth; the IV-VI group compounds may include PbS, PbSe, PbTe, SnS, SnSe, SnTe, SnSeS, SnSeTe, SnSTe, PbSeS, PbSeTe, PbSTe, and so forth; and the IV group compounds may include SiC, SiGe, and so forth.

The first PL layer 21 and the second PL layer 22 can be fabricated using methods including spray coating, dispensing, printing, molding, and so forth. One example of forming the first PL layer 21 is illustrated as follows. Firstly, the less-moisture-sensitive PL material 212 is mixed inside the uncured first polymer matrix material 211. Secondly, the slurry mixture is disposed on a substrate or the like (not shown). Thirdly, the first PL layer 21 is formed after curing (e.g., solidifying) the polymer matrix material 211 and lifting off from the substrate.

Even though the first PL layer 21 can be formed by methods described above, it may be desirable to form a high-packing-density first PL layer 21 comprising the less-moisture-sensitive PL material 212. A loosely packed less-moisture-sensitive PL material 212 inside the first PL layer 21 may result in less moisture-resistant capability and thus a poor barrier layer to the ambient oxygen and moisture. Desirably, if the photoluminescent material 212 includes phosphor particles, the first PL layer 21 can be formed by the method disclosed in U.S. Patent Publication No. US2010/0119839, which is incorporated by reference in its entirety. This method allows the phosphor particles to be deposited uniformly, so that the first PL layer 21 can have a uniform thickness. Moreover, this method may allow the phosphor particles to be deposited densely, so that the weight percentage of the less-moisture-sensitive material 212 relative to the first PL layer 21 may be not less than about 50%, not less than about 60%, or not less than about 70%, resulting in a better moisture-resistant barrier layer.

Furthermore, in some embodiments, the first PL layer 21 and the second PL layer 22 are formed sequentially, rather than being formed in a single process, to prevent the moisture-sensitive material 222 of the second PL layer 22 from being mixed into the first polymer matrix material 211 of the first PL layer 21.

The reflective structure 30 surrounding the light-emitting semiconductor die 10 and the PL structure 20 is specified to reflect back the primary light emitted from the light-emitting semiconductor die 10 and the secondary wavelength-converted light radiated from the PL structure 20. In other words, the light can be primarily or solely radiated outwardly from the upper surface 201 of the PL structure 20. Desirably, the reflective structure 30 may directly cover the edge surface 13 of the light-emitting semiconductor die 10 and the edge surface 203 of the PL structure 20.

The reflective structure 30 may also serve as another barrier layer to reduce the amount of oxygen or moisture permeating to reach the moisture-sensitive PL material 222. The reflective structure 30 comprises light scattering particles 32 dispersed within a third polymer matrix material 31. To achieve a good moisture-resistant barrier property, desirably the third polymer matrix material 31 can be selected from polymer materials having a low WVTR, for example, a resin material such as a silicone material with a WVTR not more than about 10 $g/m^2$/day measured at 2-mm layer thickness. In addition, a weight percentage ratio of the light scattering particles 32 relative to a total weight of the reflective structure 30 is not less than about 30%. Examples of the optical scattering particles 32 include, but are not limited to, $TiO_2$, BN, $SiO_2$, $Al_2O_3$, or another oxide, nitride, or other ceramic material.

The reflective structure 30 may be fabricated using methods including dispensing, printing, molding, and so forth. For example, the light scattering particles 32 may be firstly dispersed within the third polymer matrix material 31 to form a composite material of the reflective structure 30. Then the composite material may be disposed surrounding the light-emitting semiconductor die 10 and the PL structure 20 via dispensing, printing, molding, or so forth. Finally the reflective structure 30 is formed after a curing process.

Figure 1B:
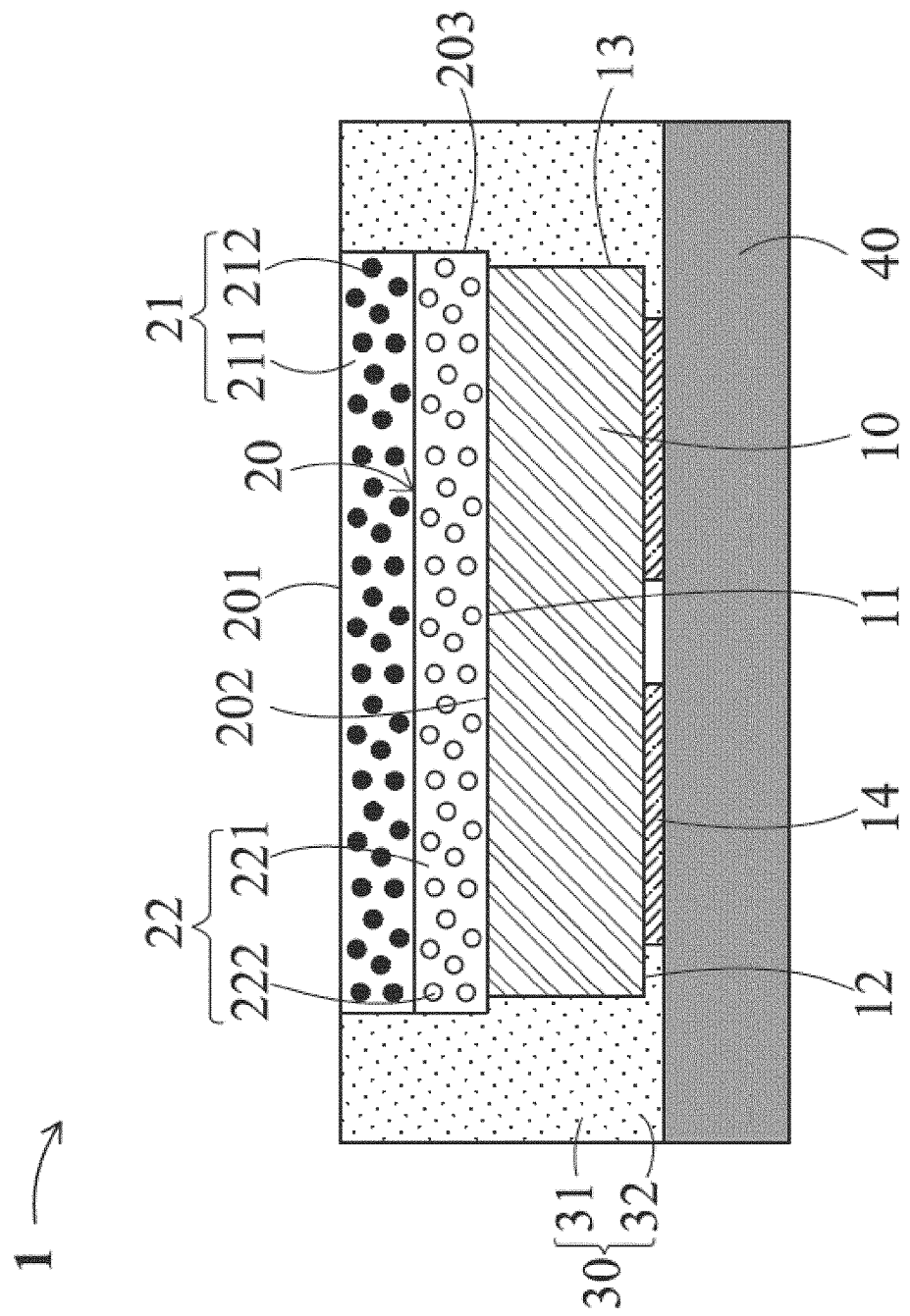

FIG. 1B shows another schematic drawing in a cross-sectional view of an LED according to some embodiments of the present disclosure. Optionally, the LED 1 further includes a substrate 40, and the light-emitting semiconductor die 10 is disposed on the substrate 40. Examples of the substrate 40 may include, but are not limited to, a ceramic substrate, a glass substrate, a printed circuit board, or a metal core printed circuit board. The LED 1 shown in FIG. 1B can be fabricated by mechanically bonding the LED 1 shown in FIG. 1A onto the substrate 40 and electrically connecting the electrodes of the LED 1 to the bonding pads of the substrate 40 using manufacturing processes such as eutectic bonding, reflow soldering, and so forth.

Figure 1C:
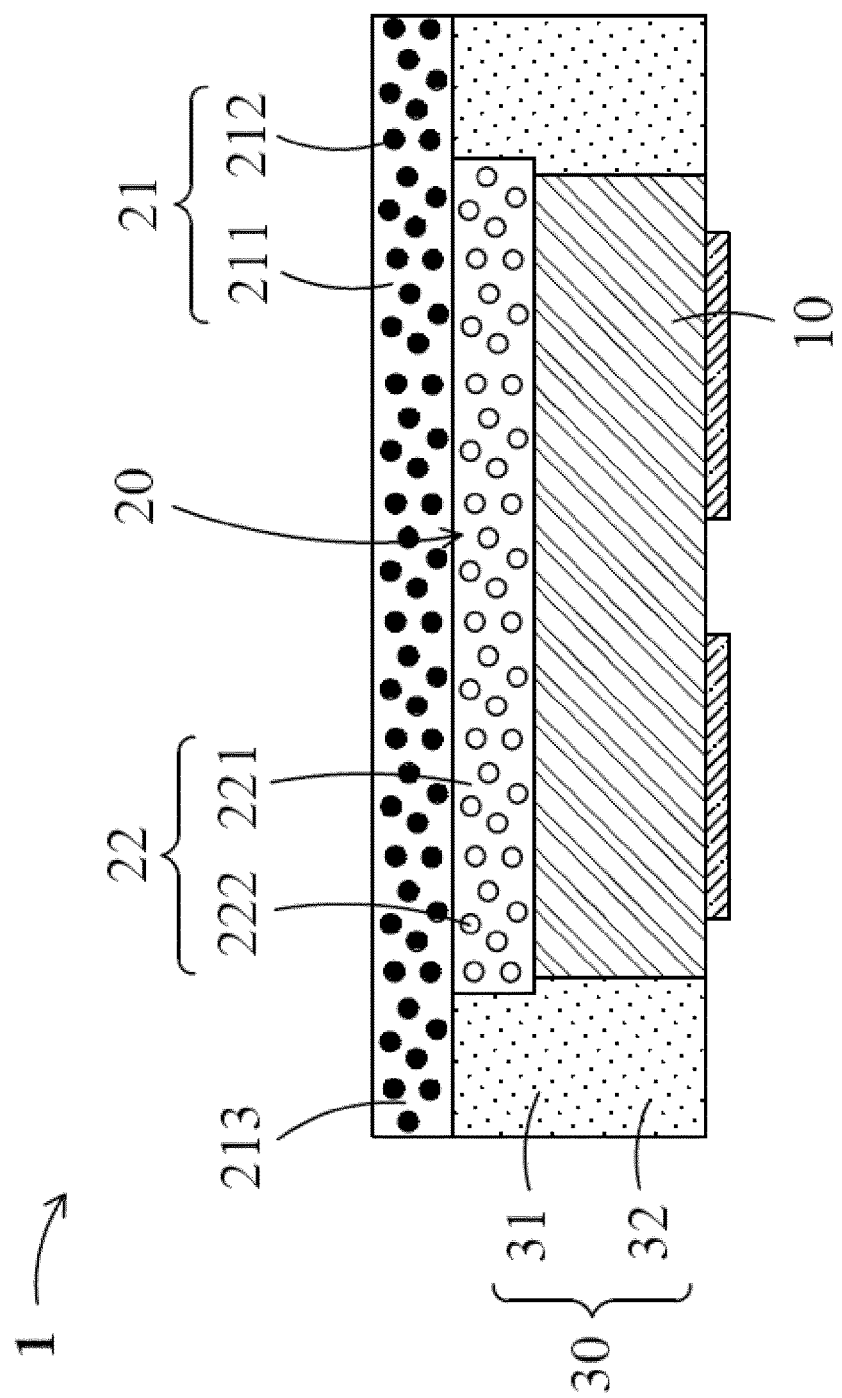

FIG. 1C shows another schematic drawing in a cross-sectional view of an LED according to some embodiments of the present disclosure. The LED 1 includes the first PL layer 21 and the second PL layer 22 with different sizes in surface areas. Specifically, as seen from the top view, the size of a top surface area of the first PL layer 21 including an extension portion 213 is larger than that of the second PL layer 22. Therefore, the first PL layer 21 completely covers the second PL layer 22, whereas the extension portion 213 of the first PL layer 21 covers the reflective structure 30. In this arrangement, the second PL layer 22 is well encapsulated and protected by both the first PL layer 21 and the reflective structure 30, wherein the extension portion 213 of the first PL layer 21 functions as a moisture barrier layer against the outside oxygen or moisture.

Figure 1D:
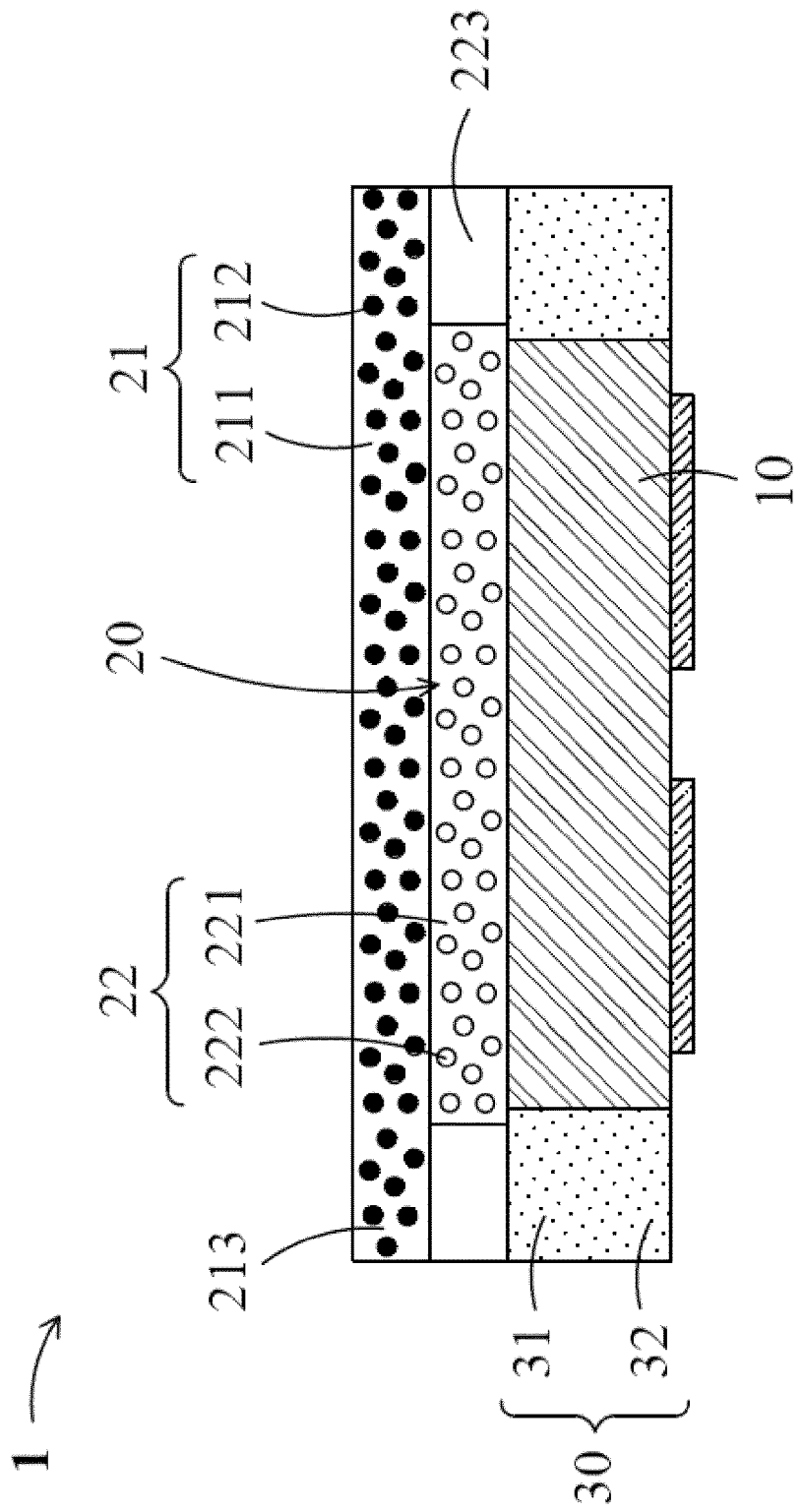
Figure 1E:
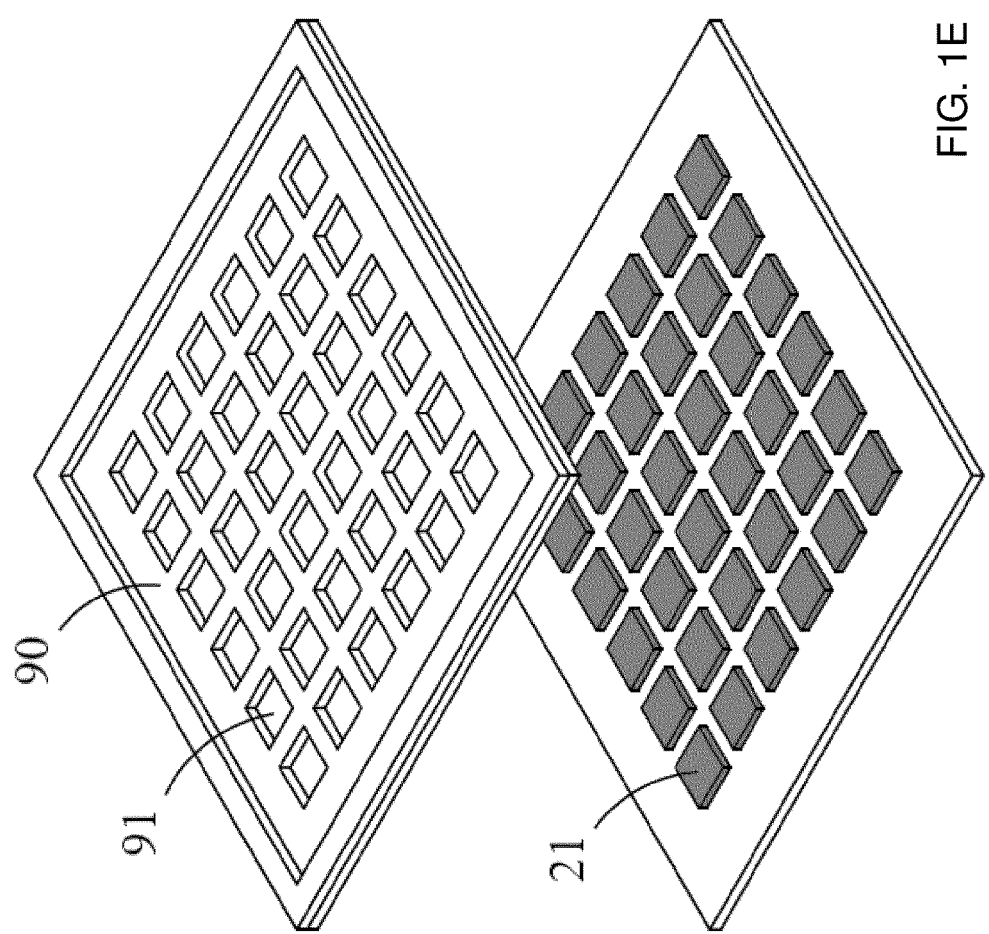
FIG. 1E and FIG. 1F are schematic drawings of shadow masks used to fabricate patterned photoluminescent layers for the LEDs shown in FIG. 1C and FIG. 1D.
Figure 1F:
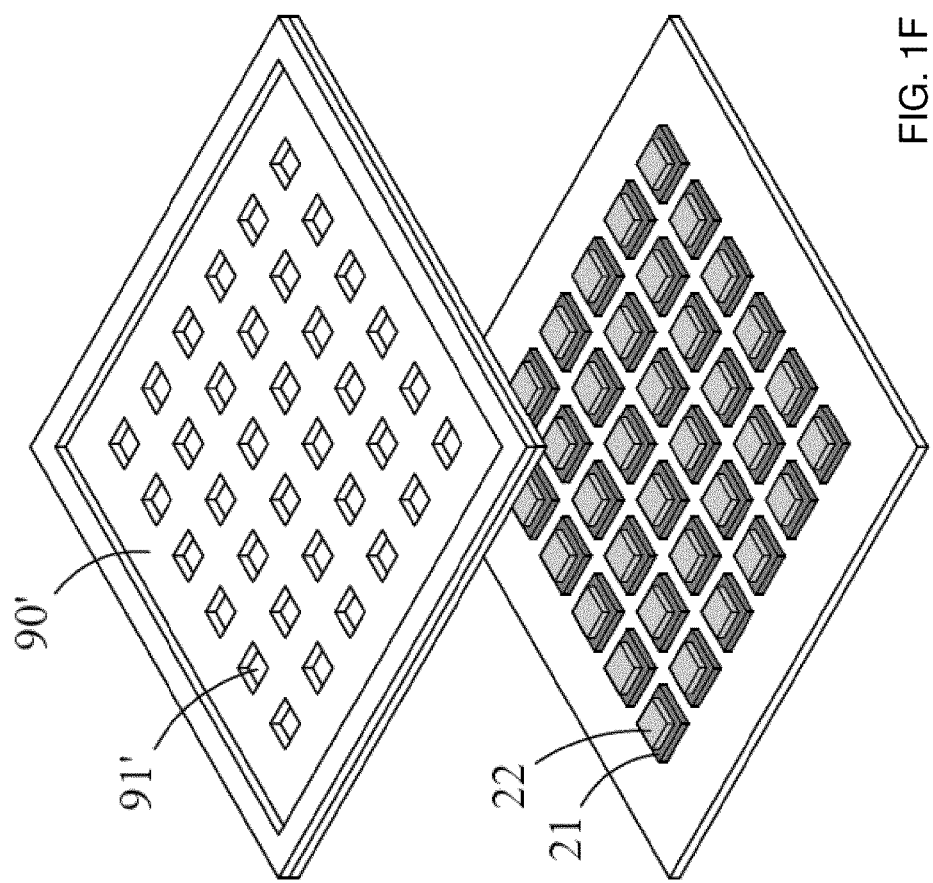

To fabricate the first PL layer 21 and the second PL layer 22 having different sizes in surface areas, the deposition method disclosed in U.S. Patent Publication No. US2010/0119839 can be used together with shadow masks 90 and 90' shown in FIG. 1E and FIG. 1F, respectively, to define patterning of the layer deposition. It will be appreciated that a size of apertures 91 of the shadow mask 90 shown in FIG. 1E is larger than a size of apertures 91' of the shadow mask 90' shown in FIG. 1F. One example of forming the first PL layer 21 with the extension portion 213 over the second PL layer 20 is illustrated as follows. Firstly, the shadow mask 90 is placed on a substrate or the like (not shown). Then the less-moisture-sensitive PL material 212 and the first polymer matrix material 211 can be selectively deposited onto the substrate through the aperture 91. Next, the shadow mask 90 is removed. Then, the first PL layer 21 is fabricated after curing the first polymer matrix material 211. The second PL layer 22 with a smaller size in surface area can be fabricated through selective deposition as well using the mask 90' with the smaller aperture 91'.

FIG. 1D shows another schematic drawing in a cross-sectional view of an LED according to some embodiments of the present disclosure. The second PL layer 22 of the LED device 1 may also include an extension portion 223 covering the reflective structure 30 and surrounding a remaining, central portion of the second PL layer 22. Thus the first PL layer 21 and the second PL layer 22 may have substantially the same size in surface areas. However, the extension portion 223 of the second PL layer 22 comprises solely the second polymer matrix material 221 without including or substantially devoid of the moisture-sensitive PL material 222, which is included in the central portion of the second PL layer 22. In this arrangement, the moisture-sensitive PL material 222 will have reduced exposure to the ambient oxygen or moisture. Thus, the extension portion 223 comprising the second polymer matrix material 221 may also function as the oxygen and moisture barrier layer.

To fabricate the extension portion 223 of the second PL layer 22 without including the moisture-sensitive PL material 222, selective deposition using the shadow masks 90 and 90' can be used. Specifically, the moisture-sensitive PL material 222 can be selectively deposited using the shadow mask 90' with the smaller aperture 91', whereas the second polymer matrix material 221 can be selectively deposited using the shadow mask 90 with the larger aperture 91 (or even without using any shadow mask). Therefore, the extension portion 223 without moisture-sensitive PL material 222 can be fabricated.

According to the above detailed descriptions, the LED 1 shows at least the following technical features.

From the point of view of optical spectra, the first PL layer 21 and the second PL layer 22 are irradiated by the primary light emitted from the light-emitting semiconductor die 10, such as a blue light, to generate the secondary converted lights having different wavelengths (e.g., green light and/or red light). Then the light comprised of different wavelengths is mixed together to generate a light with specified spectrum, such as a white light with specified CCT.

Additionally, the first PL layer 21 functions as a wavelength conversion layer, and also serves as an oxygen and moisture barrier layer to reduce the ambient oxygen and moisture from penetration and permeating through to the second PL layer 22 comprising the moisture-sensitive PL material 222. The reflective structure 30 also reduces ambient oxygen and moisture from permeating through laterally from the edge surface of the PL layers 21 and 22. Also, the light-emitting semiconductor die 10 composed of inorganic materials can inhibit oxygen and moisture from passing through vertically from its lower surface 12. In other words, the second PL layer 22 comprising the moisture-sensitive PL material 222 is substantially completely sealed by components such as the first PL layer 21, the reflective structure 30, and the light-emitting semiconductor die 10 to form a near hermetic encapsulation so that the moisture-sensitive PL material 222 of the second PL layer 22 is well protected from deleterious impact caused by outside oxygen or moisture. Desirably, the first polymer matrix material 211, the second polymer matrix material 221, and the third polymer matrix material 31 are selected from polymer materials having a low WVTR to further improve oxygen and moisture barrier properties for better protection to the moisture-sensitive PL material 222.

Furthermore, because both the first polymer matrix material 211 and the less-moisture-sensitive PL material 212 of the first PL layer 21 can serve to reduce permeation of ambient oxygen or moisture, the thickness of the first polymer matrix material 211 does not need to be increased significantly for the purpose of an oxygen and moisture barrier layer. It will be appreciated that the less-moisture-sensitive PL material 212 may be specified to have a smaller particle size or to form a higher packing density inside the first PL layer 21, so that the thickness of the first polymer matrix material 211 will not be increased proportionally while a higher weight percentage of the less-moisture-sensitive PL material 212 is desirable. Typically, the amount of the first polymer matrix material 211 may be slightly increased as the weight percentage of the less-moisture-sensitive PL material 212 is increased. Therefore, the first PL layer 21 can maintain a minimum thickness with a relatively low WVTR. As a result, the overall package size of the LED device 1 can still meet the specification of a small form factor while maintaining good oxygen and moisture barrier properties.

Lastly, if the reflective structure 30 does not provide enough encapsulation to the second PL layer 22, the surface area of the second PL layer 22 may be specified to be smaller than that of the first PL layer 21 so that better barrier properties laterally from the edge surface of the LED 1 to the second PL layer 22 can be achieved.

The aforementioned paragraphs are detailed descriptions of the embodiments related to the LED 1. Detailed descriptions of other embodiments of LEDs according to the present disclosure will be explained as follows. It will be appreciated that some detailed descriptions of the features and advantages found in the following embodiments of the LEDs are similar to those of the LED 1 and are therefore omitted for the purpose of brevity.

Figure 2A:
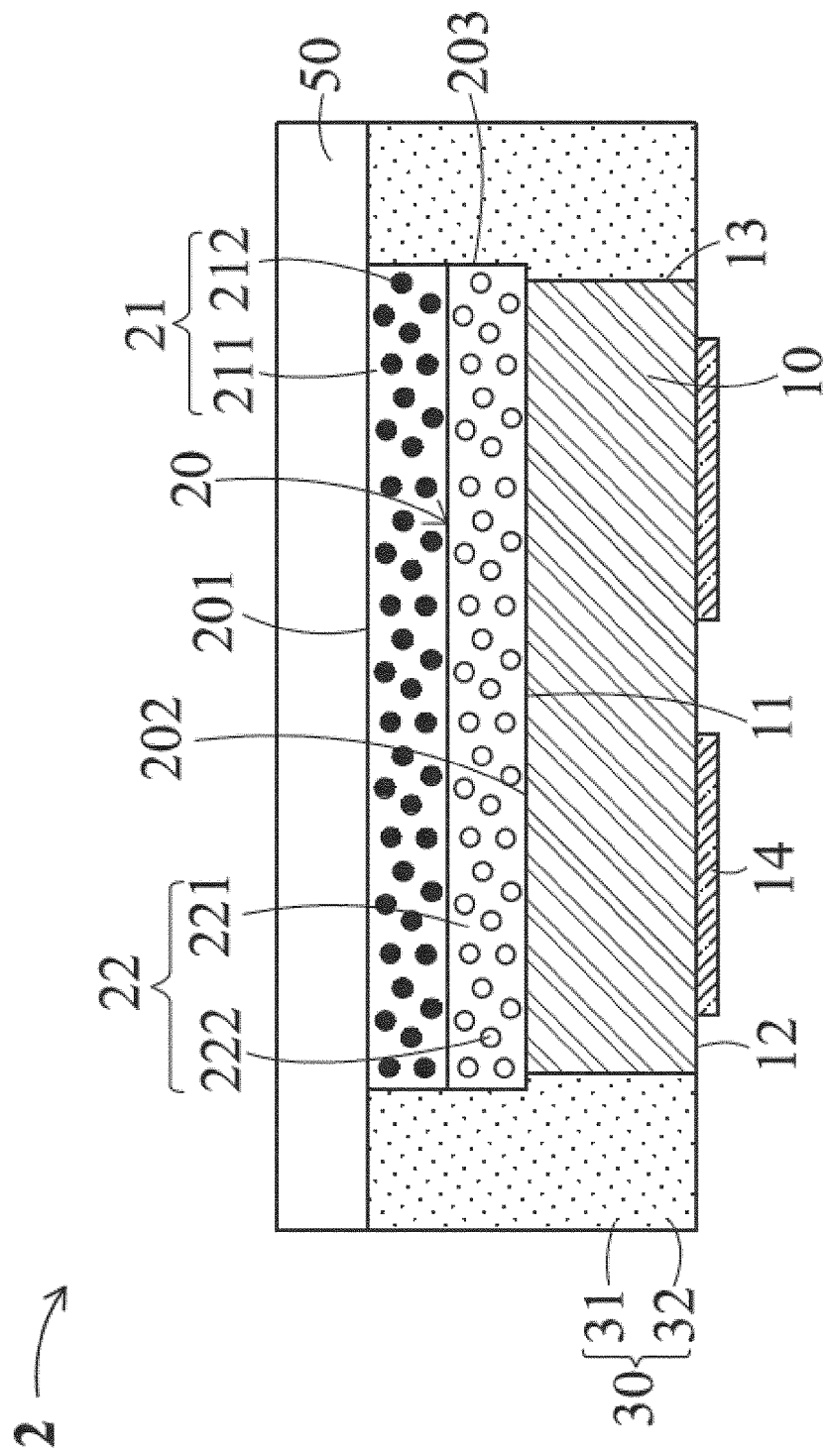
FIG. 2A, FIG. 2B, FIG. 2C, FIG. 2D, FIG. 2E, and FIG. 2F are schematic drawings in a cross-sectional view depicting LEDs according to some embodiments of the present disclosure.

FIG. 2A to FIG. 2F are schematic drawings in a cross-sectional view depicting an LED 2 according to some embodiments of the present disclosure. As shown in FIG. 2A, a difference between the LED 2 and the LED 1 is that the LED 2 further includes a transparent barrier layer 50, in addition to the components comprising the LED 1 such as the light-emitting semiconductor 10, the PL structure 20, and the reflective structure 30.

Specifically, the transparent barrier layer 50 is disposed on the PL structure 20 extending outwardly to cover the reflective structure 30. Alternatively, the transparent barrier layer 50 can be disposed selectively covering the PL structure 20 and an edge surface of the transparent barrier layer 50 is surrounded and covered by the reflective structure 30 (not shown). The transparent barrier layer 50 is optically substantially transparent to allow the light to pass through, but to reduce the ambient oxygen and moisture from permeating through, thus reducing the presence of the ambient oxygen and moisture to the moisture-sensitive PL material 222. Examples of the transparent barrier layer 50 may include, but are not limited to, a transparent inorganic layer (e.g., glass) or a low WVTR polymer layer (e.g., epoxy or silicone with a low WVTR). To fabricate the LED 2 as shown in FIG. 2A, the transparent barrier layer 50 can be laminated onto the LED 1 using an adhesive to form the LED 2.

Figure 2B:
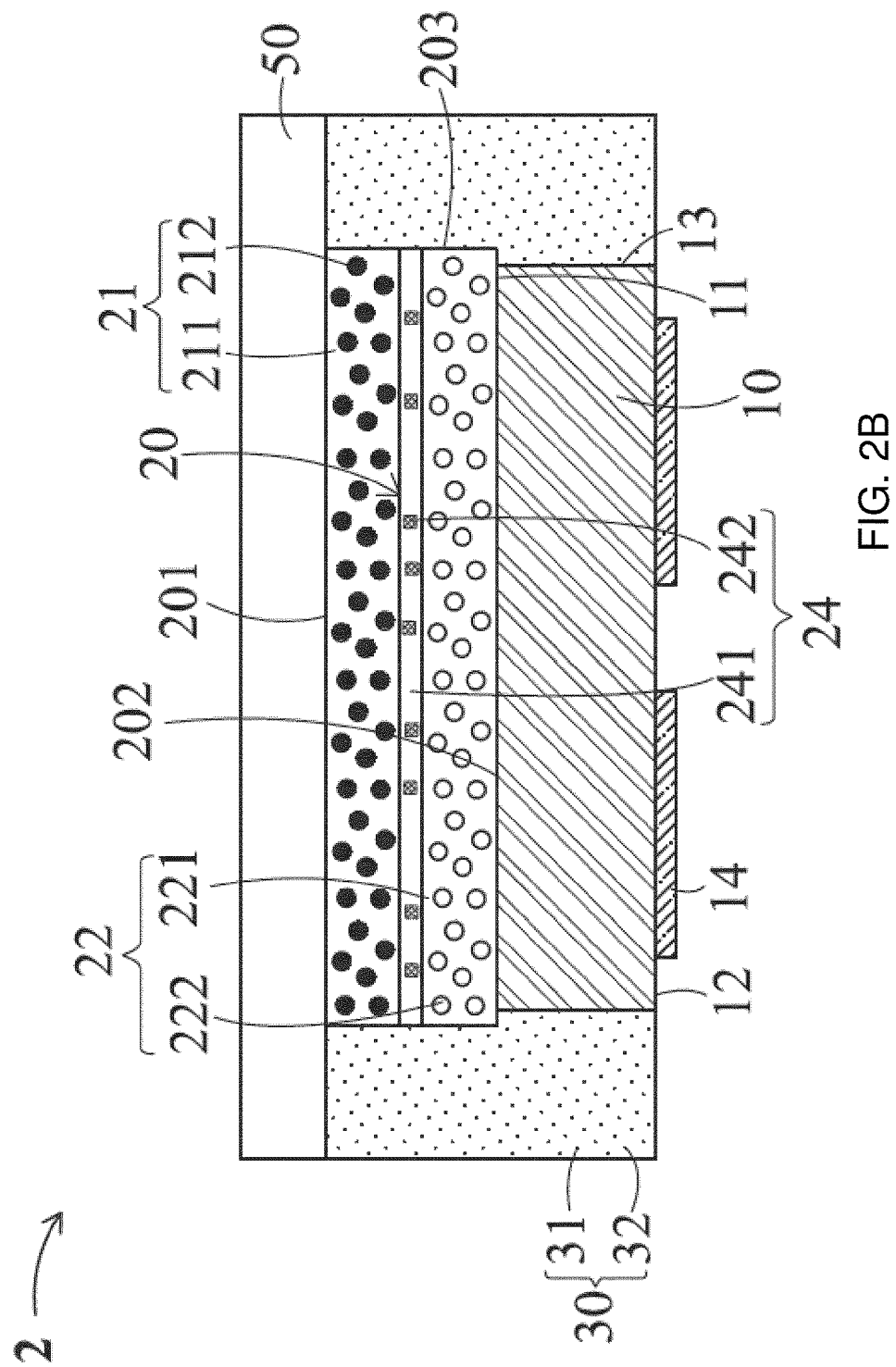

As shown in FIG. 2B, the PL structure 20 of the LED 2 may further include an optically substantially transparent getter layer 24. Desirably, the getter layer 24 can be disposed and sandwiched between the first PL layer 21 and the second PL layer 22. At least a majority amount of the ambient oxygen and moisture is blocked by the transparent barrier layer 50 and/or the first PL layer 21, but a minute amount of oxygen and moisture may still be able to permeate through these moisture barrier structures. The getter layer 24 is specified as an oxygen or moisture scavenger to adsorb, absorb, or react with the residual amount of oxygen or moisture. Therefore, the oxygen and moisture-sensitive PL material 222 of the second PL layer 22 is further protected in the depicted embodiments.

The getter layer 24 may further include a substantially transparent polymer material 241 so that a getter material 242 is mixed within the transparent polymer material 241. The transparent polymer material 241 includes, for example, a resin material such as a silicone material, a rubber material, a plastic material, or the like, and is desirably a heat-tolerant material without excessive deterioration during the operation of the LED 2. The getter material 242 may include a plurality of nanoparticles, such as zeolite, zeolitic clays, calcium oxide, barium oxide, alumina, calcium, barium, titanium, metal alloys, water absorbing oxides, activated carbon, absorptive organic materials, absorptive inorganic materials, or a combination of two or more thereof. Desirably, a size (e.g., a diameter) of the nanoparticles of the getter material 242 may be less than a quarter wavelength of the visible light, for example, less than about 200 nm, or less than about 100 nm. As for the fabrication method, the getter layer 24 can be formed by processes including dispensing, printing, molding, spraying coating, or the like.

The getter layer 24 may also be embodied without containing getter particles. For example, the getter layer 24 may be formed by solidifying a transparent liquid-phase getter material. One example of the particle-free getter layer 24 can be referred to the disclosure in U.S. Patent Publication No. US2013/0181163.

Figure 2C:
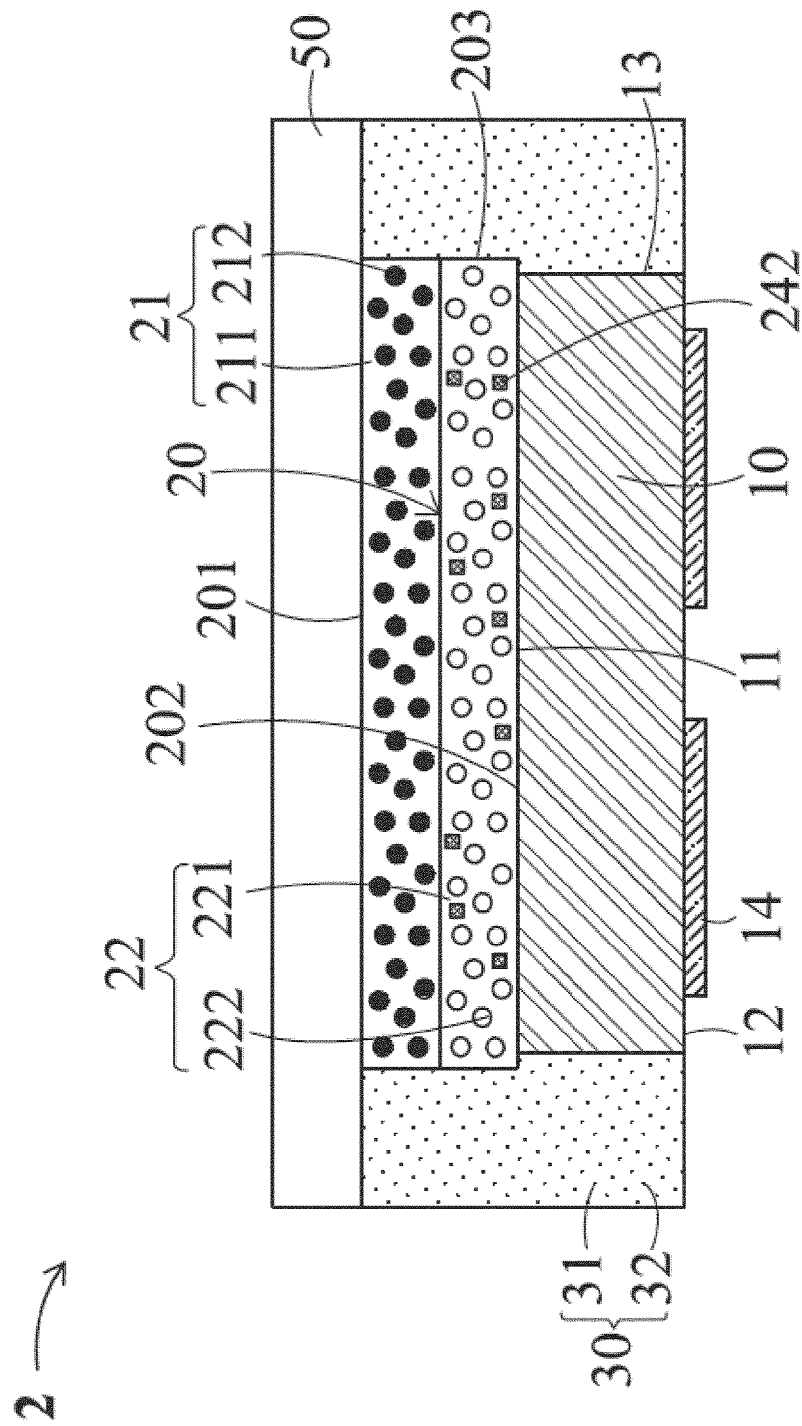
Figure 2D:
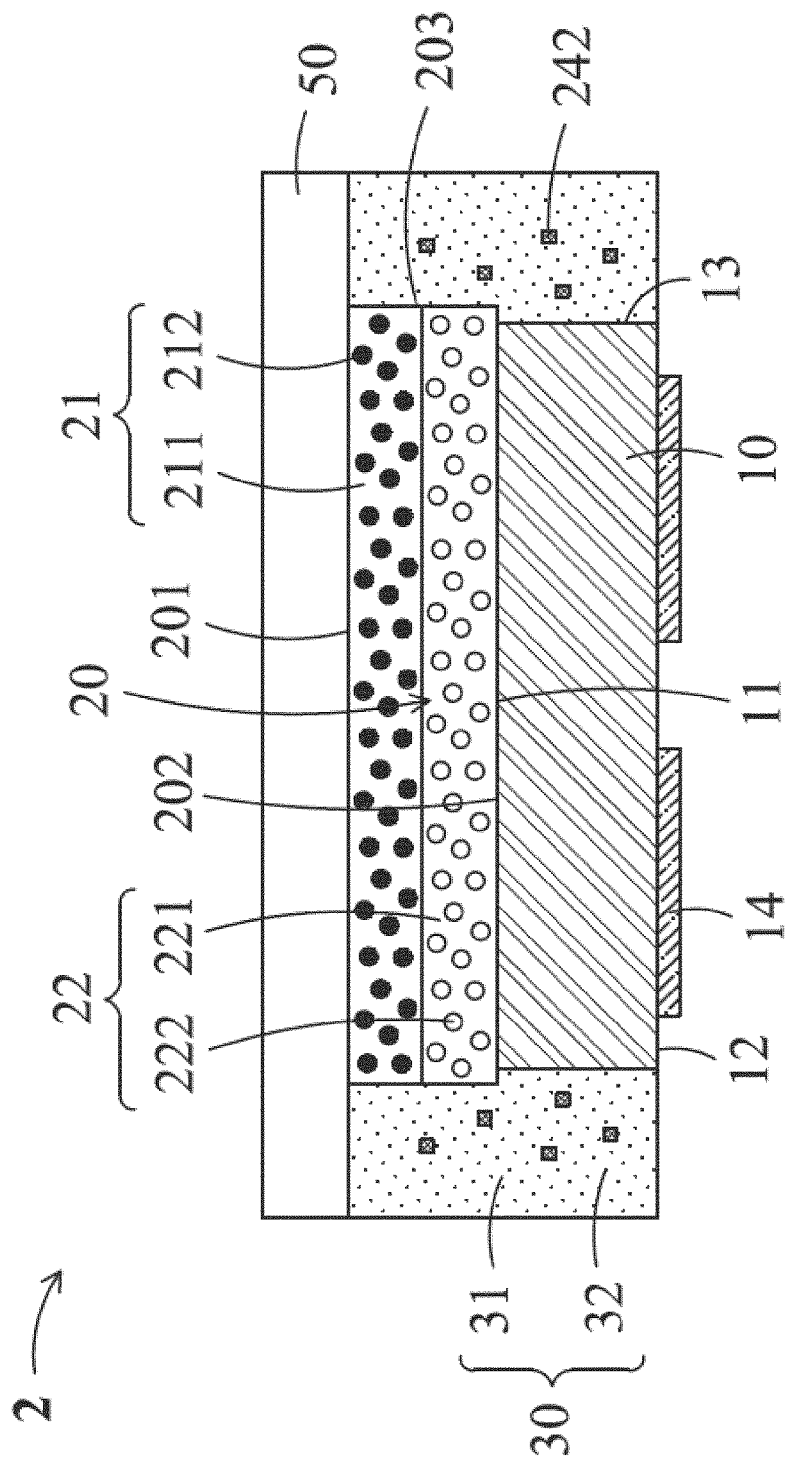

As shown in FIG. 2C, the getter material 242 can be included inside the first PL layer 21 and/or the second PL layer 22 of the LED 2. For example, the getter material 242 is directly dispersed inside the first polymer material 211 and/or the second polymer material 221. Similarly, as shown in FIG. 2D, the getter material 242 can be included inside the reflective structure 30. For example, the getter material 242 is dispersed within the third polymer matrix material 31. Thus, the ambient oxygen or moisture permeating into the first polymer material 211, the second polymer material 221, and/or the third polymer matrix material 31 can be adsorbed, absorbed, or reacted by the getter material 242, so that the moisture-sensitive PL material 222 is further sealed.

Figure 2E:
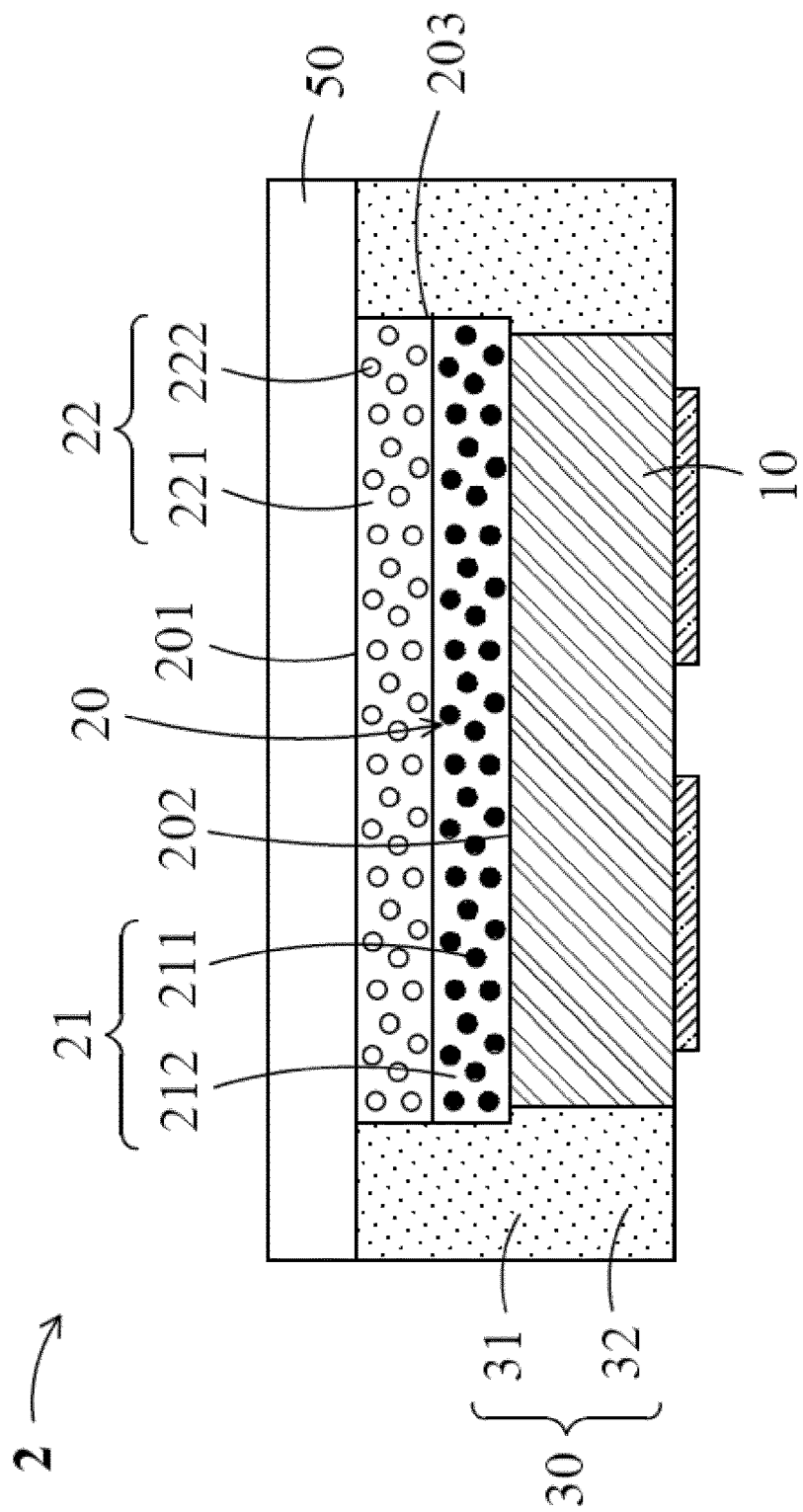

As illustrated in FIG. 2E, if the transparent barrier layer 50 includes an inorganic material with near-hermetic sealing property, such as a glass substrate, the stacking sequence of the first PL layer 21 and the second PL layer 22 in the LED 2 can be reversed. In other words, the second PL layer 22 is stacked on the first PL layer 21 so that the second PL layer 22 comprising the moisture-sensitive PL material 222 is disposed adjacent to the transparent barrier layer 50. In this arrangement, because the ambient oxygen or moisture cannot penetrate through the near-hermetic transparent barrier layer 50, the travelling distance for the ambient oxygen or moisture reaching the moisture-sensitive PL material 222 is increased from the lower surface of the reflective structure 30. Therefore, protection to the moisture-sensitive PL material 222 against the outside oxygen or moisture is further improved.

Figure 2F:
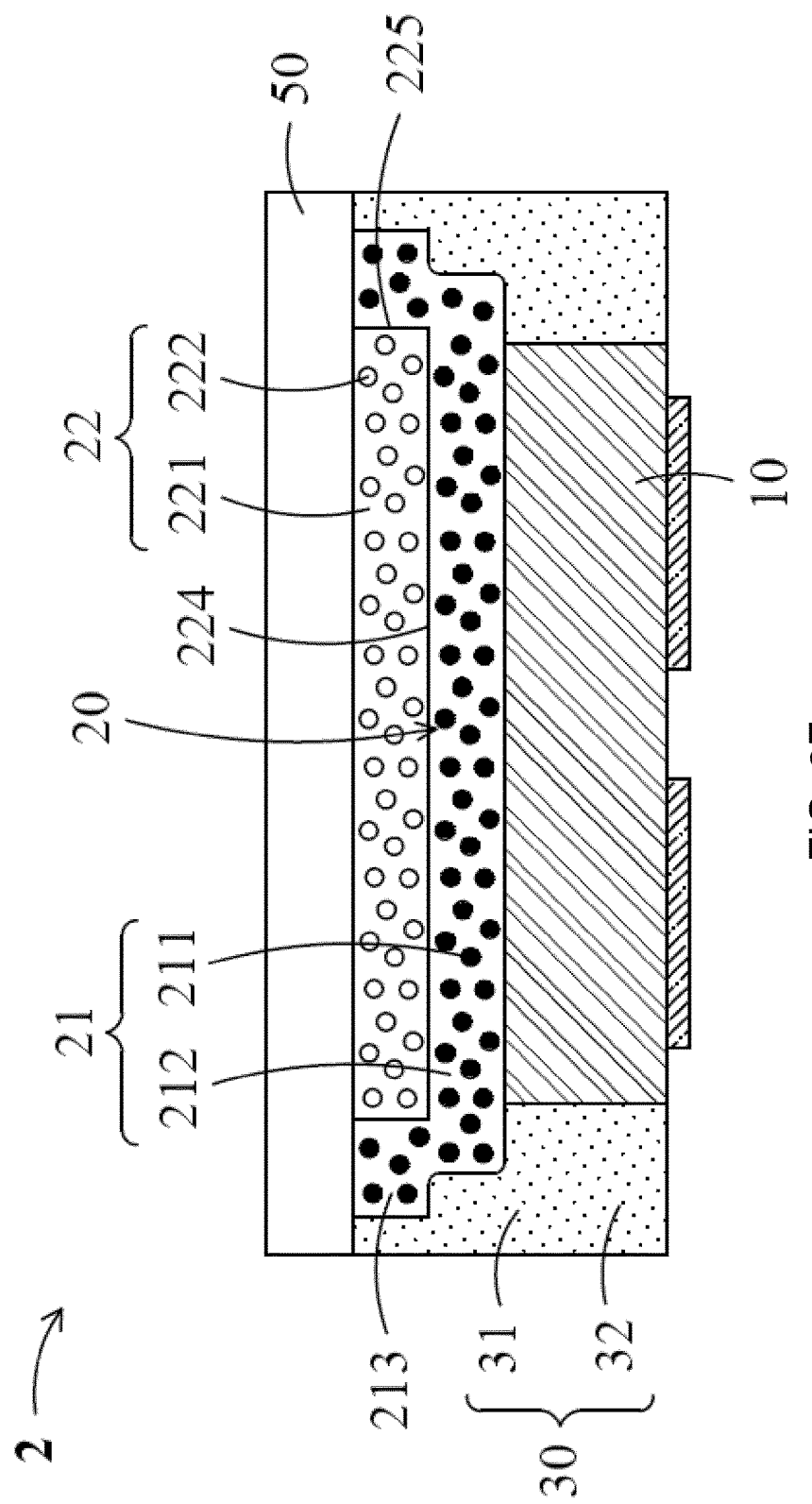

Other embodiments of the LED 2, as shown in FIG. 2F, are configured such that the second PL layer 22 is sandwiched between the transparent barrier layer 50 and the first PL layer 21, while the bottom surface 224 and the edge surface 225 of the second PL layer 22 are substantially completely covered by the first PL layer 21. In other words, the second PL layer 22 is substantially completely encapsulated by both the transparent barrier layer 50 and the first PL layer 21. In this arrangement, the moisture-sensitive PL material 222 can be even better protected against the outside oxygen or moisture from permeating through the edge surface of the reflective structure 30.

In summary, various embodiments of the LED 2, such as incorporating the transparent barrier layer 50, the getter layer 24, and/or the getter material 242, are described. Furthermore, if the transparent barrier layer 50 is near hermetic, the stacking sequence of the first PL layer 21 and the second PL layer 22 can be reversed so that the second PL layer 22 comprising the moisture sensitive photoluminescent material 222 can be substantially completely encapsulated by the transparent barrier layer 50 and the first PL layer 21. Embodiments with these technical features can provide better protection for the moisture-sensitive PL material 222 against deleterious impact of ambient oxygen and moisture.

Figure 3:
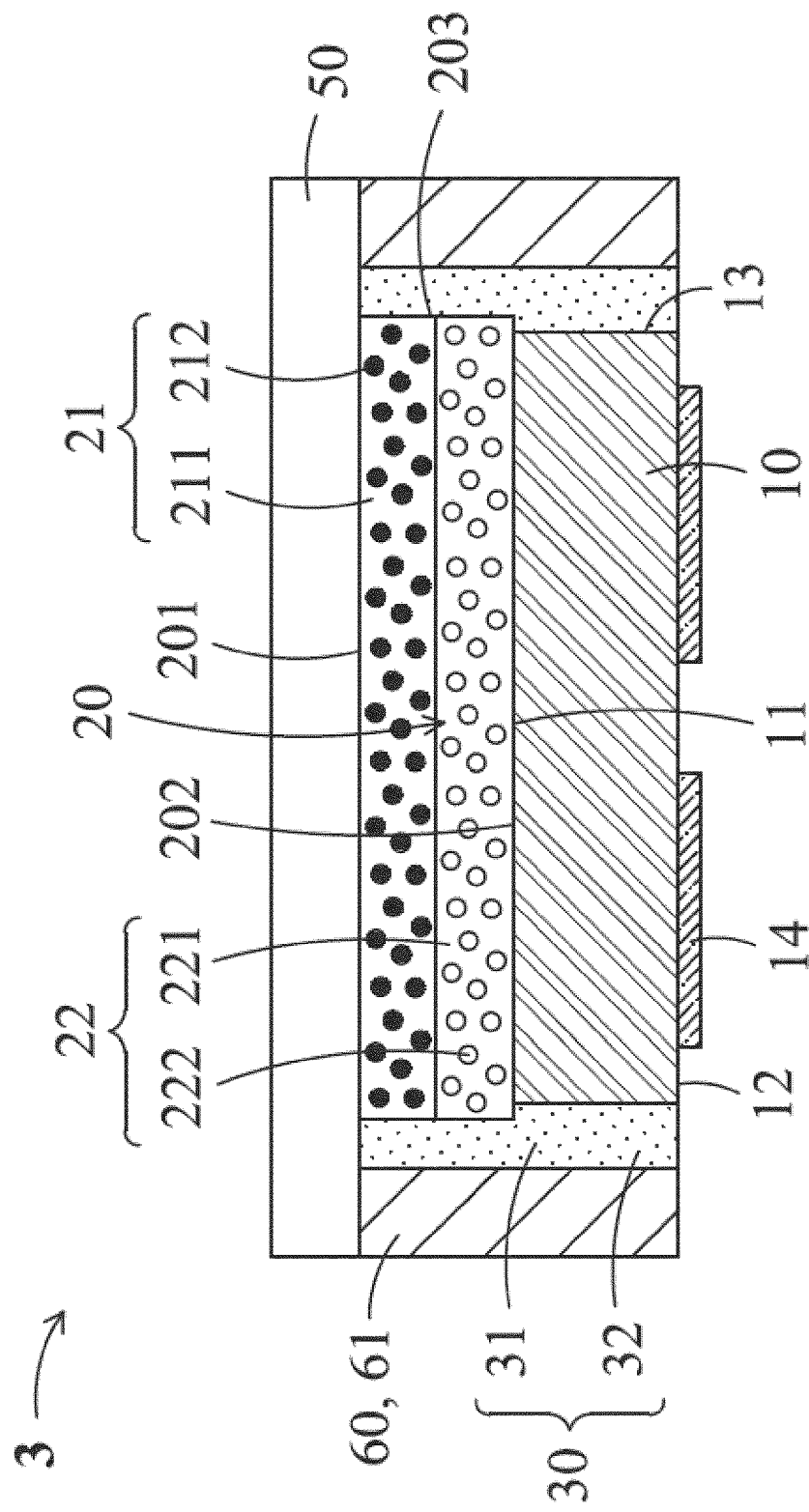
FIG. 3 is a schematic drawing in a cross-sectional view depicting an LED according to some embodiments of the present disclosure.

FIG. 3 shows a schematic drawing in a cross-sectional view depicting an LED 3 according to some embodiments of the present disclosure. A difference between the LED 3 and the LED 2, as shown in FIG. 2A, is that the LED 3 further includes a moisture-barrier reflective structure 60 surrounding the reflective structure 30.

It is desirable that a polymer material with a low WVTR is used to form the reflective structure 30 to serve as a better oxygen and moisture barrier. However, low-WVTR polymer materials may tend to deteriorate and be susceptible to yellowing or darkening under irradiation of the higher-energy primary light emitted from the LED semiconductor die 10, such as a blue light or an UV light. Also, these materials may have poor thermal stability against heat. Therefore, the low-WVTR polymer materials may not be favorable to be used in certain high-power LED applications. For example, phenyl group silicone materials have a lower WVTR than methyl group silicone materials; however, the methyl group silicone materials have better thermal stability than the phenyl group silicone materials. To address this issue, the LED 3 is specified to further include the additional moisture-barrier reflective structure 60 surrounding and covering the outer surface of the reflective structure 30. In this arrangement, because the reflective structure 30 is adjacent to the hot light-emitting semiconductor die 10, it can be specified using more thermally stable materials under the environment of heat and under irradiation of blue/UV light, even if these materials have a higher WVTR. Namely, the main function of the reflective structure 30 is to provide a reflector for the blue or UV light emitted from the light-emitting semiconductor die 10. On the other hand, the moisture-barrier reflective structure 60 can be specified using low-WVTR polymer materials to function as an oxygen or moisture barrier layer. In the depicted embodiments, the LED 3 possesses good thermal stability against heat and against irradiation generated from the light-emitting semiconductor die 10, as well as provides near-hermetic encapsulation against ambient oxygen or moisture. Alternatively in the device structure, the transparent barrier layer 50 can be extended laterally to cover the moisture-barrier reflective structure 60 to reduce oxygen and moisture penetration from the upper surface.

Desirably, the moisture-barrier reflective structure 60 comprises a fourth polymer matrix material 61 having a low WVTR, for example, not greater than about 10 $g/m^2/day$ measured at 2-mm layer thickness. Examples of the fourth polymer matrix material 61 may include, but are not limited to, a resin material such as a silicone material. The resin or silicone materials may have a higher concentration of particular function groups, such as phenyl groups, to reduce their WVTR.

The moisture-barrier reflective structure 60 may further include light scattering particles (not shown) dispersed within the fourth polymer matrix material 61. Desirably, a weight percentage of the light scattering particles relative to a total weight of the moisture-barrier reflective structure 60 is not less than about 10%. Thus, the moisture-barrier reflective structure 60 may also serve as a reflector to reflect back the light penetrating through the inner reflective structure 30, thus reducing the potential blue-light leakage escaping from the four peripheral edge surfaces of the LED device 3. Additionally, the moisture barrier structure 60 may further reduce its WVTR by including the light scattering particles inside so as to achieve better oxygen and moisture barrier properties.

On the other hand, the reflective structure 30 is specified to reflect back at least a majority of the primary light (especially blue or UV light) emitted from the light-emitting semiconductor die 10 and the secondary light radiated from the PL structure 20. Therefore, the intensity of the leakage light experienced by the outer moisture-barrier reflective structure 60 after penetrating through the inner reflective structure 30 is greatly reduced. Thus, the material deterioration of the moisture-barrier reflective structure 60 incurred by irradiation of blue light or UV light is not as severe, even though the materials may be less thermally stable. In addition, the moisture-barrier reflective structure 60 will experience less heat because it is not in direct contact with the heat source of the light-emitting semiconductor die 10, where the reflective structure 30 is sandwiched in-between. So the material deterioration induced by heat is not as severe either. Besides, in order to avoid or reduce the material deterioration of the reflective structure 30 caused by heat or irradiation from blue or UV light, the third polymer matrix material 31 of the reflective structure 30 can be specified from the resin or the silicone materials having higher thermal stability and more tolerable under irradiation of blue light or UV light, such as methyl group silicone materials.

As for the manufacturing method of the LED 3, the moisture-barrier reflective structure 60 can be fabricated using similar fabrication processes such as dispensing, printing, molding, and so forth. An example fabrication process is illustrated as follows. Firstly, similar to the method to fabricate the reflective structure 30 of the LED 1 as described in the aforementioned paragraphs, the reflective structure 30 of the LED 3 is formed. Next, the moisture-barrier reflective structure 60 is formed by disposing a slurry material of the moisture-barrier reflective structure 60 surrounding the reflective structure 30 through dispensing, printing, or molding processes. Then, a curing process follows to complete the fabrication procedure. Furthermore, the transparent barrier layer 50 can be disposed on the PL structure 20 before or after forming the moisture-barrier reflective structure 60 to complete the fabrication process of the depicted embodiments of the LED 3 featured with the moisture-barrier reflective structure 60 and the transparent barrier layer 50.

In summary, the LED 3 embodied with both the moisture-barrier reflective structure 60 and the reflective structure 30 is more suitable for high power applications while the moisture-sensitive PL material 222 is desirably to be used.

The LEDs 1 to 3 disclosed according to the present disclosure can effectively improve oxygen or moisture barrier properties of the CSP LEDs. However, these devices are characterized as top-surface emitting, namely light primarily or solely radiating from the upper surface of the CSP LED device, and thus are more suitable for those applications involving a smaller viewing angle. The layer-by-layer photoluminescent structures having good oxygen and moisture barrier properties according to the present disclosure can also be included in a five-surface emitting CSP LED device, namely light radiating from the upper surface and four peripheral edge surfaces of the CSP LED device. Accordingly, the five-surface emitting CSP LED device comprising a moisture-sensitive PL material can be used for those applications involving a large viewing angle.

Figure 4A:
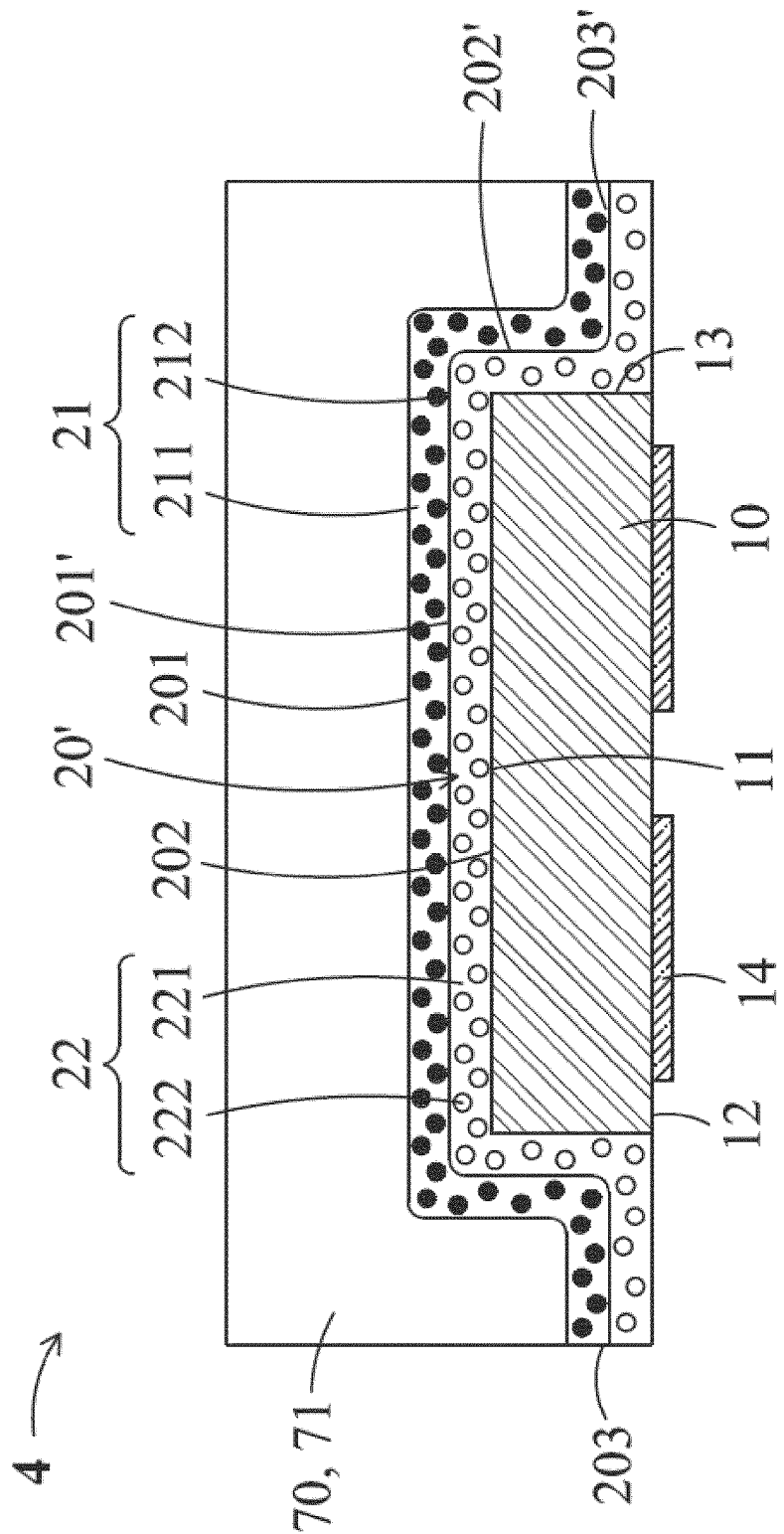
FIG. 4A, FIG. 4B, FIG. 4C, and FIG. 4D are schematic drawings in a cross-sectional view depicting LEDs according to some embodiments of the present disclosure.

FIG. 4A to FIG. 4D are schematic drawings in a cross-sectional view illustrating an LED 4 according to some embodiments of the present disclosure. As shown in FIG. 4A, the LED 4 includes a light-emitting semiconductor die 10, a PL structure 20', and an encapsulation structure 70, wherein the PL structure 20' is shaped differently from the PL structure 20 in the aforementioned embodiments (e.g., the PL structure 20 shown in FIG. 1A). From a geometric perspective, the PL structure 20 is a substantially planar layer covering and adjoining the upper surface 11 of the light-emitting semiconductor die 10, whereas the PL structure 20' is conformally covering and adjoining the upper surface 11 as well as the edge surface 13 of the light-emitting semiconductor die 10.

Specifically, the PL structure 20' comprises a top portion 201', an edge portion 202', and an extension portion 203'. The top portion 201' is disposed covering the upper surface 11 of the light-emitting semiconductor die 10, and the edge portion 202' is connected to the top portion 201' extending downward to cover the edge surface 13 of the light-emitting semiconductor die 10. A lower surface of the edge portion 202' may be level with the lower surface 12 of the light-emitting semiconductor die 10. The extension portion 203' is connected to the edge portion 202' extending laterally away from the edge portion 202'. The layer-by-layer PL structure 20' includes a second PL layer 22 and a first PL layer 21 disposed on the second PL layer 22. Thus the top portion 201', the edge portion 202', and the extension portion 203' comprises both layers of the first PL layer 21 and the second PL layer 22.

The transparent encapsulation structure 70 is disposed on the PL structure 20' covering an upper surface 201 of the top portion 201', an edge surface of the edge portion 202', and an upper surface of the extension portion 203'. An edge surface of the transparent encapsulation structure 70 may be aligned vertically with an edge surface 203 of the extension portion 203'. In other embodiments (not shown), the transparent encapsulation structure 70 may also cover the edge surface 203 of the extension portion 203' to form a better seal for the PL structure 20'. The transparent encapsulation structure 70 includes a substantially transparent polymer material 71 desirably having a low WVTR to resist penetration and permeation of the ambient oxygen and moisture.

Figure 4B:
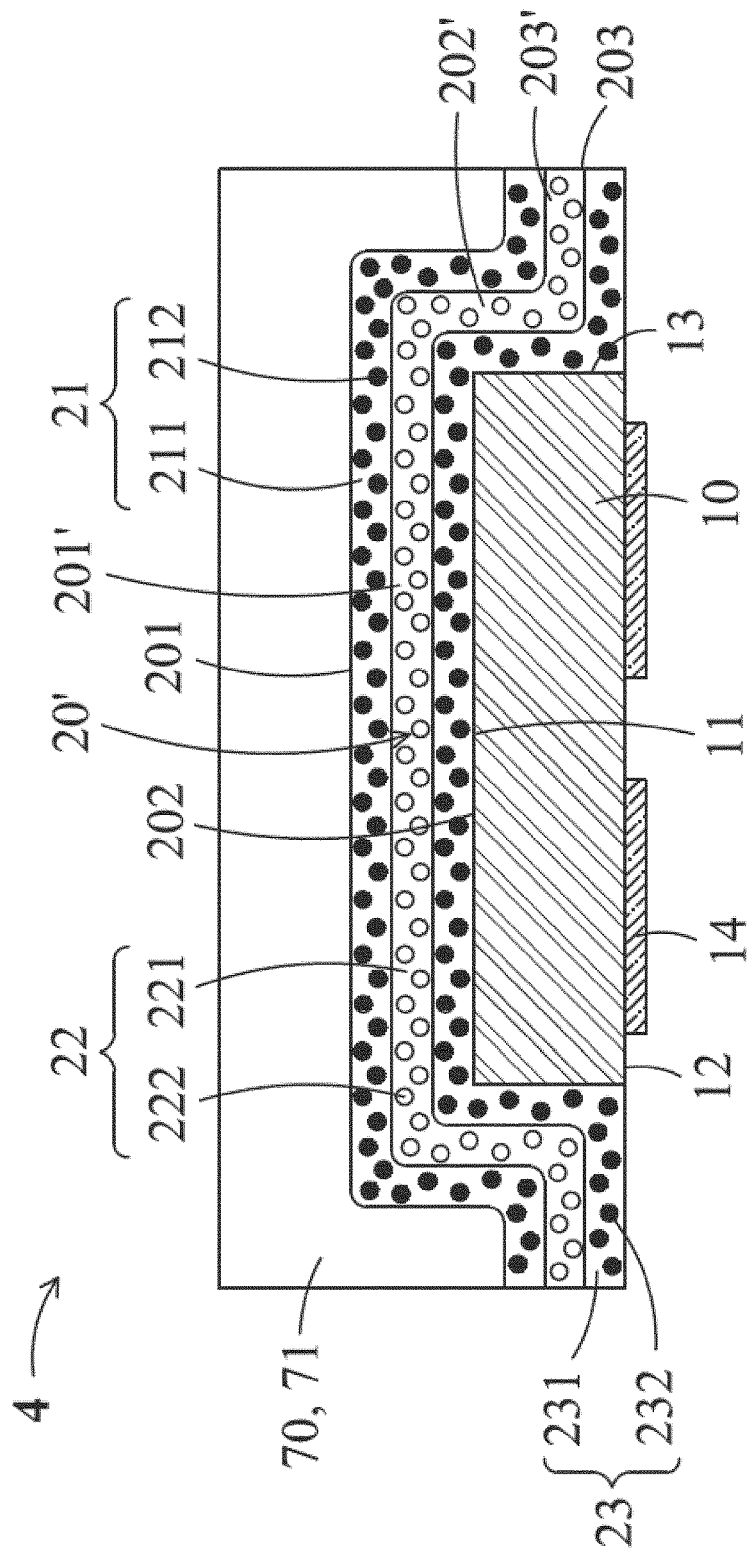

As shown in FIG. 4B, the layer-by-layer PL structure 20' may further include a third photoluminescent layer 23 (hereinafter abbreviated as third PL layer 23) disposed on the light-emitting semiconductor die 10 and underneath the first PL layer 21 and the second PL layer 22. In other words, the second PL layer 22 comprising the oxygen or moisture sensitive photoluminescent material 222 is sandwiched between the first PL layer 21 and the third PL layer 23. The third PL layer 23 comprises a third photoluminescent material (e.g., a less-moisture-sensitive photoluminescent material) 232 (hereinafter abbreviated as less-moisture-sensitive PL material 232) dispersed within a fifth polymer matrix material 231. The technical specifications of both components can be referred to those of the first polymer matrix material 211 and the less-moisture-sensitive PL material 212 of the first PL layer 21 as illustrated in the aforementioned paragraphs.

Therefore, the light emitted by the light-emitting semiconductor die 10 and the PL structure 20' can be radiated outwardly from the upper surface and also from the four edge surfaces of the LED 4; namely, the LED 4 is characterized as a five-surface emitting CSP LED. Therefore, the LED 4 can have a larger viewing angle. In addition, the first PL layer 21, the third PL layer 23, and the transparent encapsulation structure 70 are specified with a low WVTR to reduce penetration and permeation of the ambient oxygen or moisture from reaching the second PL layer 22 comprising the moisture-sensitive PL material 222.

Figure 4C:
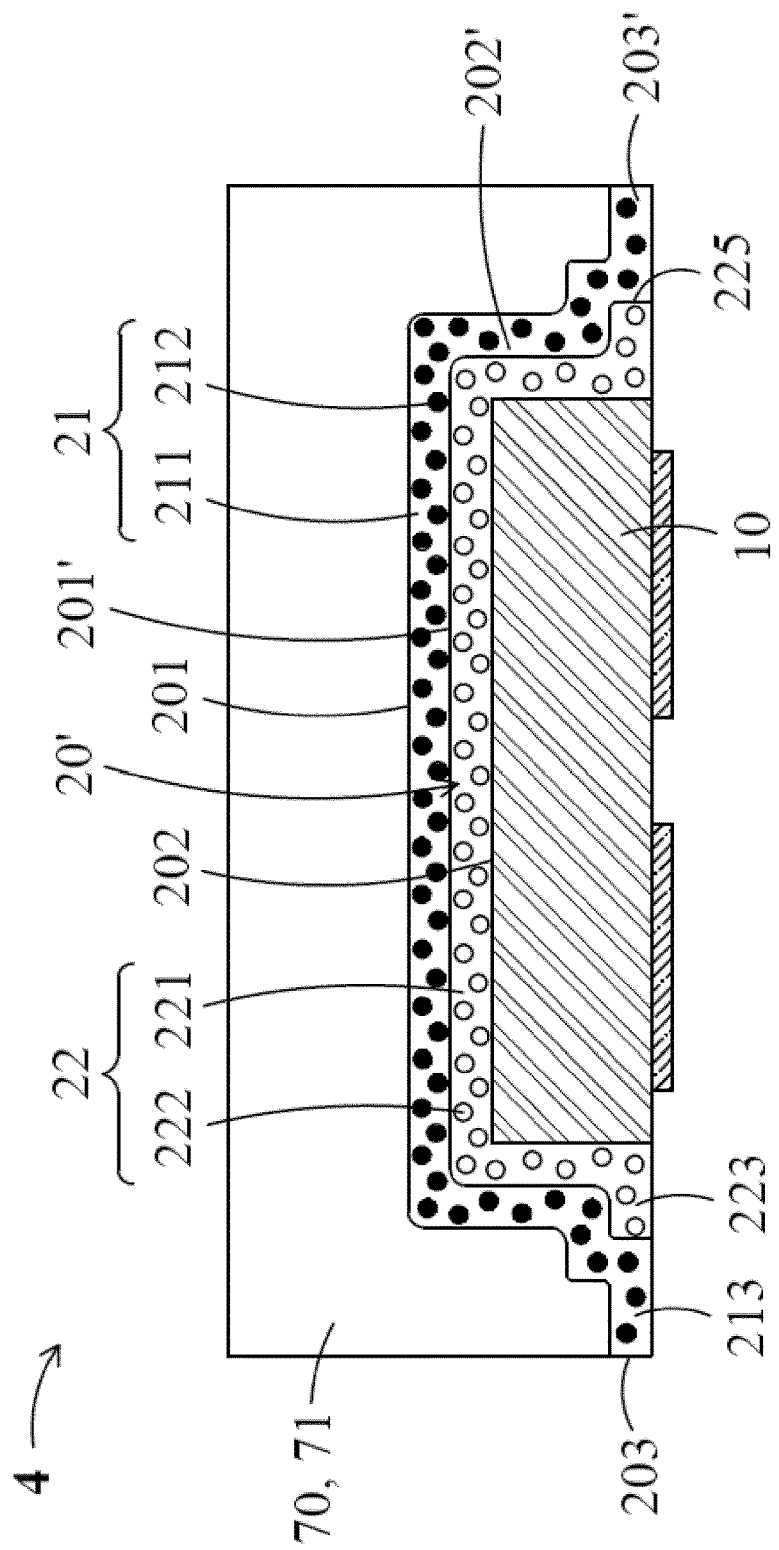

Even though the second PL layer 22 comprising the moisture-sensitive PL material 222 is well protected, there may still be a slight risk of attack by oxygen or moisture especially penetrating from the edge surface 203 of the LED 4. To address this potential risk, as shown in FIG. 4C, additional embodiments of a five-surface emitting CSP LED device is illustrated. Similar to the PL structure 20 of the LED 1 shown in FIG. 1C, the first PL layer 21 and the second PL layer 22 of the PL structure 20' in the LED 4 are specified to have different sizes of the coverage areas. Specifically, as seen from the top view, the first PL layer 21 disposed on the second PL layer 22 has a larger coverage area so that the second PL layer 22 comprising the moisture-sensitive PL material 222 is substantially fully encapsulated. Desirably, the extension portion 213 of the first PL layer 21 is specified to extend outwardly to substantially fully cover the edge surface 225 of the extension portion 223 of the second PL layer 22. With this arrangement, the first PL layer 21 comprising the less oxygen and moisture sensitive photoluminescent material 212 may further minimize oxygen or moisture permeating into the second PL layer 22 comprising the oxygen and moisture sensitive photoluminescent material 222, especially from the lateral edge direction.

Figure 4D:
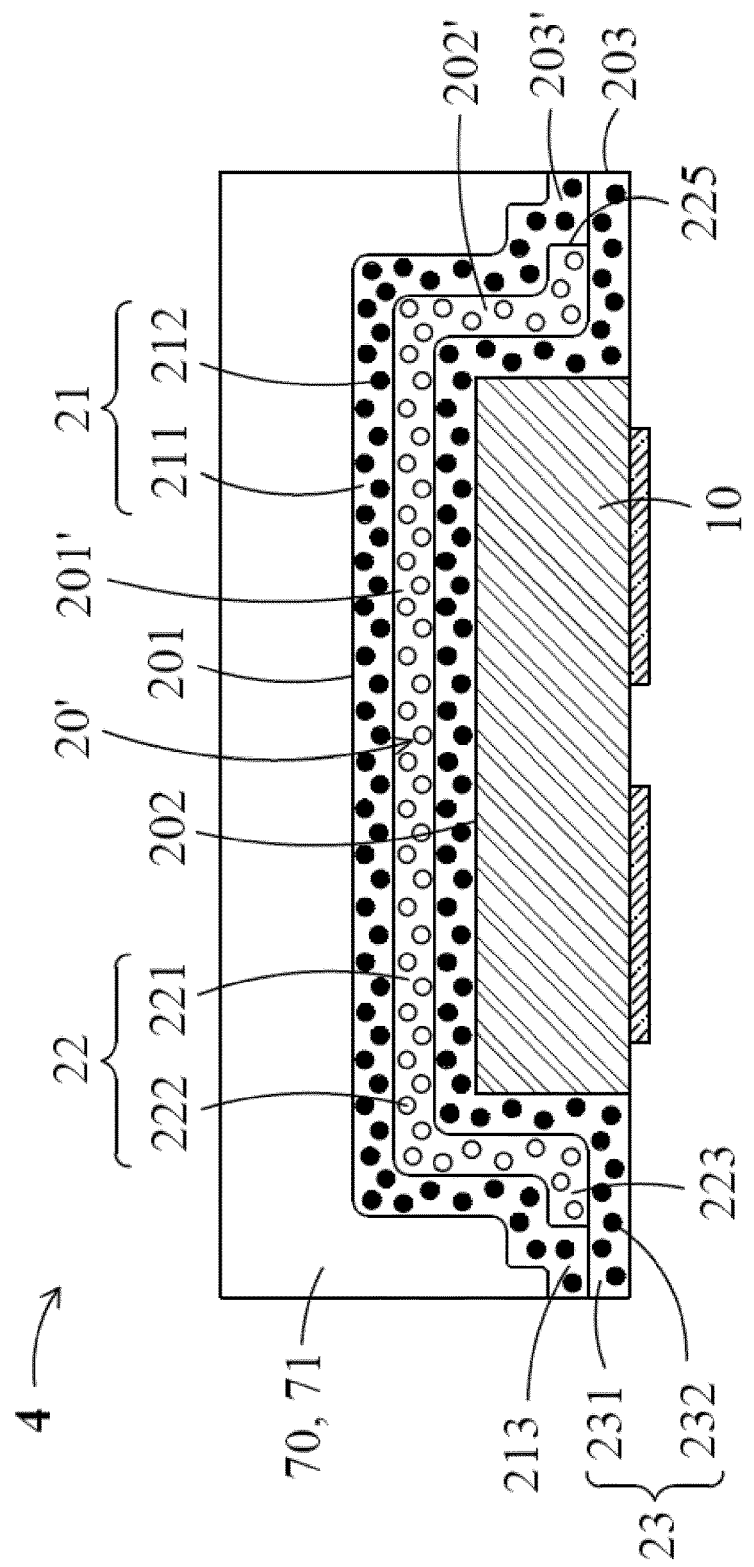

As shown in FIG. 4D, the LED 4 can further include a third PL layer 23 disposed on the light-emitting semiconductor die 10 and underneath the first PL layer 21 and the second PL layer 22; namely, the second PL layer 22 is sandwiched between the first PL layer 21 and the third PL layer 23. The second PL layer 22 is specified to have a smaller coverage area so that it is encapsulated inside the first PL layer 21 and the third PL layer 23. Therefore, the oxygen and moisture barrier properties are further improved.

As for a manufacturing procedure to fabricate the LED 4, one example is to form the layer-by-layer PL structure 20' on the light-emitting semiconductor die 10 by the method disclosed in U.S. Patent Publication No. US2010/0119839. More specifically, the third PL layer 23, the second PL layer 22, and the first PL layer 21 are disposed in a sequential manner. Next, the transparent encapsulation structure 70 can be formed by a dispensing, a printing, or a molding process on the PL structure 20' to complete the fabrication process of the LED 4. Moreover, if selective deposition of the first PL layer 21, the second PL layer 22, or the third PL layer 23 is specified, shadow masks with different aperture sizes can be used to fabricate the corresponding PL layers with different sizes of the coverage areas. The selective deposition processes of the PL layers using shadow masks can be referred to the technical descriptions illustrated in FIG. 1E, FIG. 1F and the corresponding paragraphs.

Figure 5A:
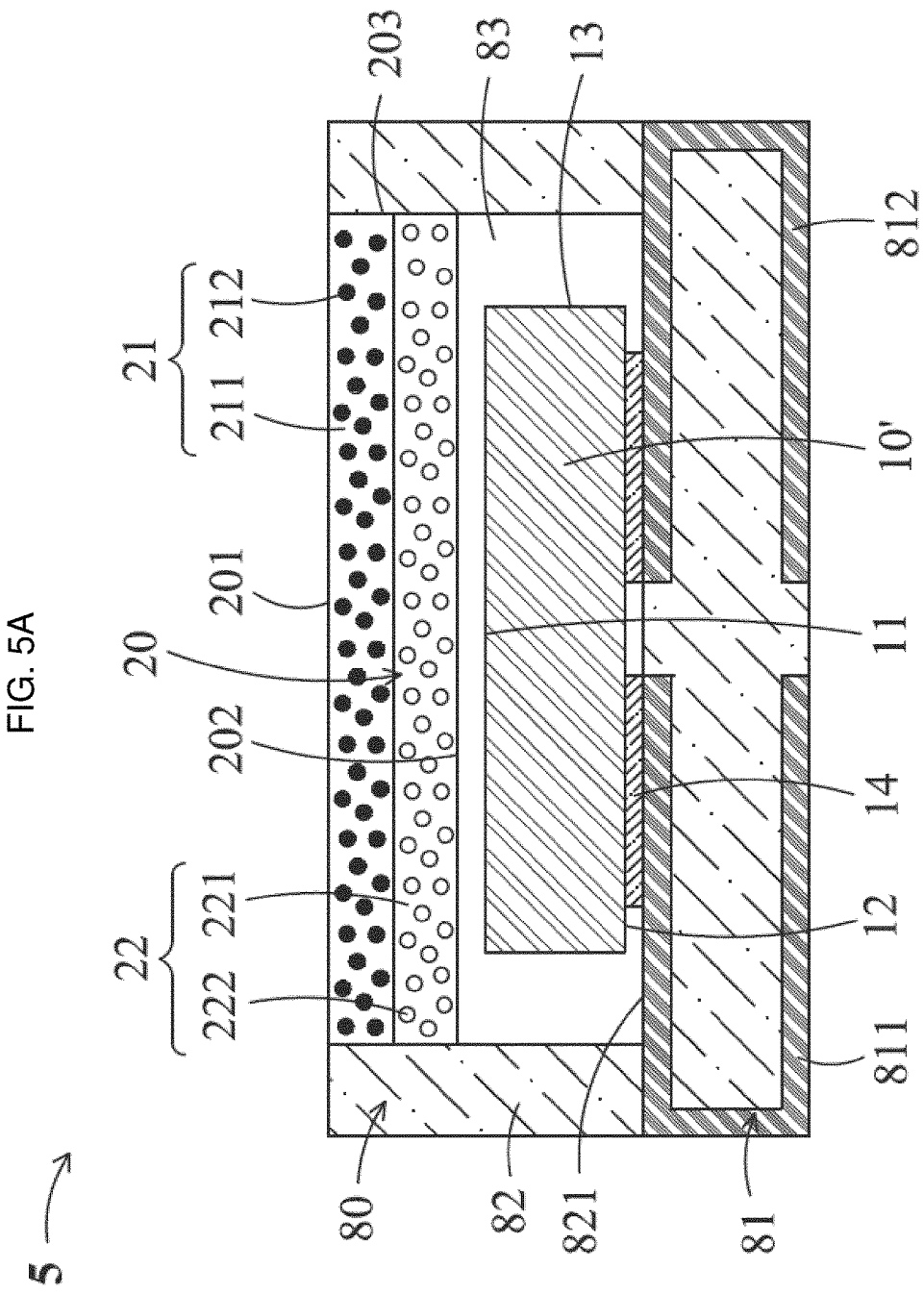
FIG. 5A and FIG. 5B are schematic drawings in a cross-sectional view depicting LEDs according to some embodiments of the present disclosure.
Figure 5B:
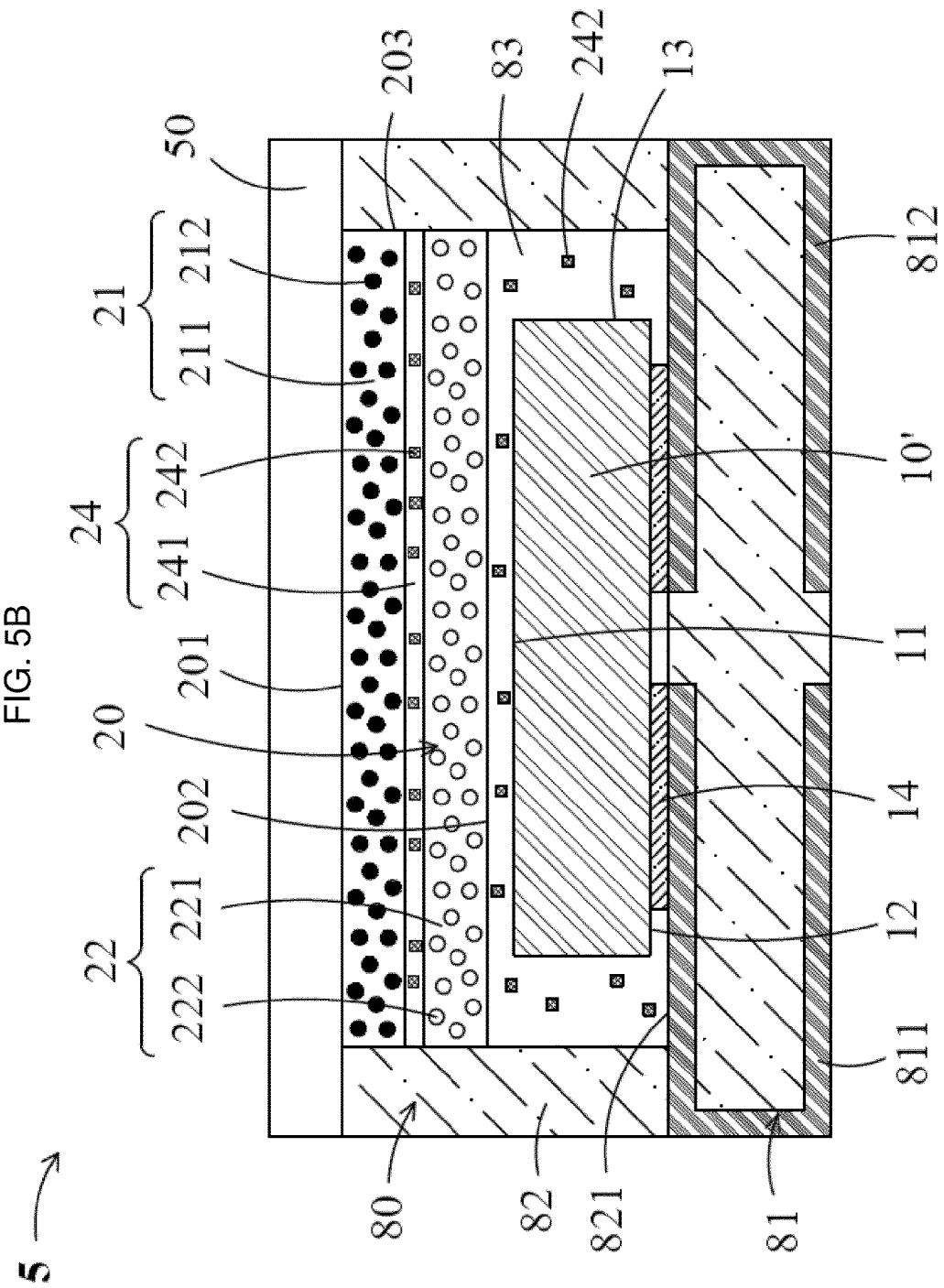

The layer-by-layer photoluminescent structure with good oxygen and moisture barrier properties according to the present disclosure can also be used for embodiments of lead-frame-type LED devices comprising moisture-sensitive PL materials. FIG. 5A and FIG. 5B are schematic drawings in a cross-sectional view depicting an LED 5 according to some embodiments of the present disclosure. As shown in FIG. 5A, the LED 5 includes a light-emitting semiconductor die 10', a packaging structure 80 and a PL structure 20. The light-emitting semiconductor die 10' may be a flip-chip light-emitting semiconductor die, a vertical light-emitting semiconductor die, or a horizontal (face-up) light-emitting semiconductor die.

The packaging structure 80 includes a lead frame 81 and a reflector 82. The lead frame 81, including a first electrode 811 and a second electrode 812 that are electrically isolated from each other, can be formed by a punching process. The reflector 82 is disposed or formed on the lead frame 81. At least portions of the first electrode 811 and the second electrode 812 are exposed for electrical connection to the electrodes 14 of the light-emitting semiconductor die 10'. The exposed areas of the first and the second electrodes 811 and 812 may also be used as bonding pads for wire bonding, or other manner of electrical connection to the light-emitting semiconductor die 10'.

Desirably, the reflector 82 is disposed on the lead frame 81 to form a reflective optical cavity 821. The material composition of the reflector 82 can be the same or similar to that of the reflective structure 30 as shown in FIG. 1A, such as light scattering particles dispersed inside a polymer material. Therefore, the reflector 82 may also have a low WVTR. Examples of the material used to form the reflector 82 include, but are not limited to, polyphthalamide (PPA), polycyclohexylene-di-methylene terephthalate (PCT), epoxy molding compound (EMC), or silicone molding compound (SMC).

The light-emitting semiconductor die 10' is disposed inside the optical cavity 821 and is electrically connected to the first electrode 811 and the second electrode 812. The PL structure 20 is disposed inside the optical cavity 821 so that the PL structure 20 covers the light-emitting semiconductor die 10'. Therefore, the primary light emitted from the light-emitting semiconductor die 10' and the secondary light converted by the PL structure 20 can be solely or primarily radiated outwardly from the upper surface 201. According to some embodiments as shown in FIG. 5A, the PL structure 20 is spaced apart from the light-emitting semiconductor die 10' by including a substantially transparent polymer material 83 disposed between the light-emitting semiconductor die 10' and the PL structure 20 inside the packaging structure 80. Thus, the extra space above the upper surface 11 of the light-emitting semiconductor die 10' allows electrical connection of the light-emitting semiconductor die 10' to the electrodes 811 and 812 of the lead frame 81 through wire bonding feasible.

As for a manufacturing method to fabricate the LED device 5, an example fabrication process is illustrated as follows. Firstly, the light-emitting semiconductor die 10' is mechanically bonded to the lead frame 81 and electrically connected to the electrodes 811 and 812. Next, the PL structure 20 is formed desirably by the method disclosed in U.S. Patent Publication No. US2010/0119839, and then disposed on the light-emitting semiconductor die 10' so that the lower surface 202 of the PL structure 20 adjoins the upper surface 11 of the light-emitting semiconductor die 10'. Alternatively, to form the LED 5 according to other embodiments, the substantially transparent polymer material 83 can be disposed to form a spacer above the light-emitting semiconductor die 10' before the PL structure 20 is attached.

On the other hand, according to a comparative moisture-resistant lead-frame-type LED device, a silicone over-layer is disposed covering a top surface of a lead-frame-type LED to minimize penetration of the ambient moisture, thus avoiding degradation of moisture sensitive photoluminescent materials. However, the LED 5 according to the depicted embodiments of the present disclosure is configured to replace the silicone over-layer by the first PL layer 21 comprising the less-moisture-sensitive PL material 212 dispersed in the first polymer matrix material 211. With this arrangement, the moisture barrier layer is the first PL layer 21 to better protect the second PL layer 22 comprising the moisture-sensitive PL material 222. Thus, the depicted embodiments of the LED 5 may omit a considerably thicker silicone over-layer as the moisture barrier layer, which will inevitably increase the overall form factor. A more compact LED is more favorable in applications such as electronic products involving a thinner and more compact form factor.

As shown in FIG. 5B, the LED 5 can further include a transparent barrier layer 50 disposed on the PL structure 20. More specifically, the transparent barrier layer 50 may further cover the upper surface of the reflector 82. In addition, a getter material 242 can also be included inside the PL structure 20 (e.g., within the getter layer 24) and/or the transparent polymer material 83.

In summary, the LEDs according to the embodiments of the present disclosure comprise various moisture-resistant structures to improve oxygen and moisture barrier properties. For example, various embodiments of the moisture-resistant structures including the layer-by-layer PL structure, the reflective structure, the transparent barrier layer, the moisture-barrier reflective structure, the getter layer, the packaging structure, or the like, are specified to avoid or reduce oxygen and moisture from reaching the moisture-sensitive PL materials, while not significantly increasing the overall form factor of the LED.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A light-emitting device comprising:
a light-emitting semiconductor die comprising an upper surface, an edge surface, a lower surface, and a set of electrodes disposed adjacent to the lower surface;
a photoluminescent structure disposed on the light-emitting semiconductor die and comprising a second photoluminescent layer and a first photoluminescent layer disposed on the second photoluminescent layer, wherein the first photoluminescent layer comprises a first polymer matrix material and a first photoluminescent material dispersed within the first polymer matrix material, and the second photoluminescent layer comprises a second polymer matrix material and a second photoluminescent material dispersed within the second polymer matrix material, and the first photoluminescent material is different from the second photoluminescent material; and
a reflective structure at least covering the edge surface of the light-emitting semiconductor die, wherein the reflective structure comprises a third polymer matrix material and light scattering particles dispersed within the third polymer matrix material,
wherein a water vapor transmission rate of each the first polymer matrix material and the third polymer matrix material is not more than 10 g/m$^2$/day measured at 2-mm layer thickness.

2. The light-emitting device according to claim 1, wherein a weight percentage of the first photoluminescent material to the first photoluminescent layer is not less than 50%.

3. The light-emitting device according to claim 1, wherein a medium particle size of the first photoluminescent material is not more than 30 μm.

4. The light-emitting device according to claim 1, wherein a weight percentage of the light scattering particles to the reflective structure is not less than 30%.

5. The light-emitting device according to claim 1, wherein:
the first photoluminescent material comprises an oxynitride phosphor material; and
the second photoluminescent material comprises a fluoride phosphor material activated with Manganese.

6. The light-emitting device according to claim 1, wherein a surface area of the first photoluminescent layer is larger than a surface area of the second photoluminescent layer, and the first photoluminescent layer further covers the reflective structure.

7. The light-emitting device according to claim 1, wherein the second photoluminescent layer further comprises a central portion and an extension portion surrounding the central portion, so that the second photoluminescent material is selectively included in the central portion away from the extension portion.

8. The light-emitting device according to claim 1, wherein the photoluminescent structure further comprises a substantially transparent getter layer disposed between the first photoluminescent layer and the second photoluminescent layer.

9. The light-emitting device according to claim 1, wherein at least one of the first photoluminescent layer or the second photoluminescent layer further comprises a getter material dispersed within the first polymer matrix material or the second polymer matrix material.

10. The light-emitting device according to claim 1, further comprising a substrate, wherein the light-emitting semiconductor die and the reflective structure are disposed on the substrate.

11. The light-emitting device according to claim 1, wherein the first photoluminescent material is less moisture sensitive than the second photoluminescent material.

12. The light-emitting device according to claim 1, further comprising a moisture barrier layer disposed on the photoluminescent structure.

13. The light-emitting device according to claim 12, wherein the moisture barrier layer is a substantially transparent inorganic layer or a substantially transparent polymer layer.

14. The light-emitting device according to claim 12, wherein the moisture barrier layer covers the reflective structure.

15. A light-emitting device comprising:
a light-emitting semiconductor die comprising an upper surface, an edge surface, a lower surface, and a set of electrodes disposed adjacent to the lower surface;
a photoluminescent structure disposed on the light-emitting semiconductor die and comprising a second photoluminescent layer and a first photoluminescent layer disposed on the second photoluminescent layer, wherein the first photoluminescent layer comprises a first polymer matrix material and a first photoluminescent material dispersed within the first polymer matrix material, and the second photoluminescent layer comprises a second polymer matrix material and a second photoluminescent material dispersed within the second polymer matrix material, and the first photoluminescent material is different from the second photoluminescent material; and
a reflective structure at least covering the edge surface of the light-emitting semiconductor die, wherein the reflective structure comprises a third polymer matrix material and light scattering particles dispersed within the third polymer matrix material,
wherein the first photoluminescent material comprises an inorganic phosphor material, and the second photoluminescent material comprises a phosphor material activated with a reactive metal or a semiconductor nanocrystal material.

16. A light-emitting device comprising:
a light-emitting semiconductor die comprising an upper surface, an edge surface, a lower surface, and a set of electrodes disposed adjacent to the lower surface;
a photoluminescent structure disposed on the light-emitting semiconductor die and comprising a second photoluminescent layer and a first photoluminescent layer disposed on the second photoluminescent layer, wherein the first photoluminescent layer comprises a first polymer matrix material and a first photoluminescent material dispersed within the first polymer matrix material, and the second photoluminescent layer comprises a second polymer matrix material and a second photoluminescent material dispersed within the second polymer matrix material, and the first photoluminescent material is different from the second photoluminescent material; and
a reflective structure at least covering the edge surface of the light-emitting semiconductor die, wherein the reflective structure comprises a third polymer matrix material and light scattering particles dispersed within the third polymer matrix material,
wherein the reflective structure further comprises a getter material dispersed within the third polymer matrix material.

17. A light-emitting device comprising:
a light-emitting semiconductor die comprising an upper surface, an edge surface, a lower surface, and a set of electrodes disposed adjacent to the lower surface;
a photoluminescent structure disposed on the light-emitting semiconductor die and comprising a second photoluminescent layer and a first photoluminescent layer disposed on the second photoluminescent layer, wherein the first photoluminescent layer comprises a first polymer matrix material and a first photoluminescent material dispersed within the first polymer matrix material, and the second photoluminescent layer comprises a second polymer matrix material and a second photoluminescent material dispersed within the second polymer matrix material, and the first photoluminescent material is different from the second photoluminescent material; and
a reflective structure at least covering the edge surface of the light-emitting semiconductor die, wherein the reflective structure comprises a third polymer matrix material and light scattering particles dispersed within the third polymer matrix material,
further comprising a moisture-barrier reflective structure surrounding and covering the reflective structure, wherein the moisture-barrier reflective structure comprises a fourth polymer matrix material having a water vapor transmission rate not more than 10 $g/m^2/day$ measured at 2-mm layer thickness.

18. The light-emitting device according to claim 17, wherein the moisture-barrier reflective structure further comprises light scattering particles dispersed within the fourth polymer matrix material, and a weight percentage of the light scattering particles to the moisture-barrier reflective structure is not less than 10%.

19. A light-emitting device comprising:
a light-emitting semiconductor die comprising an upper surface, an edge surface, a lower surface, and a set of electrodes disposed adjacent to the lower surface;
a photoluminescent structure disposed on the light-emitting semiconductor die, wherein the photoluminescent structure comprises a second photoluminescent layer and a first photoluminescent layer disposed on the second photoluminescent layer, each of the first and the second photoluminescent layers comprising a top portion covering the upper surface of the light-emitting semiconductor die, an edge portion connected to the top portion and covering the edge surface of the light-emitting semiconductor die, and an extension portion extended outwardly from the edge portion; and
an encapsulation structure disposed on the photoluminescent structure;
wherein the first photoluminescent layer comprises a first polymer matrix material and a first photoluminescent material dispersed within the first polymer matrix material; the second photoluminescent layer comprises a second polymer matrix material and a second photoluminescent material dispersed within the second polymer matrix material; the first photoluminescent material is less moisture sensitive than the second photoluminescent material; and the encapsulation structure comprises a substantially transparent polymer material,
wherein a water vapor transmission rate of the substantially transparent polymer material comprised in the encapsulation structure is not more than 10 $g/m^2/day$ measured at 2-mm layer thickness.

20. The light-emitting device according to claim 19, wherein the extension portion of the second photoluminescent layer comprises an edge surface, which is covered and encapsulated by the first photoluminescent layer.

21. The light-emitting device according to claim 19, wherein a medium particle size of the first photoluminescent material is not more than 30 μm.

22. The light-emitting device according to claim 19, further comprising a substrate, wherein the light-emitting semiconductor die and the photoluminescent structure are disposed on the substrate.

23. A light-emitting device comprising:
a light-emitting semiconductor die comprising an upper surface, an edge surface, a lower surface, and a set of electrodes disposed adjacent to the lower surface;
a photoluminescent structure disposed on the light-emitting semiconductor die, wherein the photoluminescent structure comprises a second photoluminescent layer and a first photoluminescent layer disposed on the second photoluminescent layer, each of the first and the second photoluminescent layers comprising a top portion covering the upper surface of the light-emitting semiconductor die, an edge portion connected to the top portion and covering the edge surface of the light-emitting semiconductor die, and an extension portion extended outwardly from the edge portion; and
an encapsulation structure disposed on the photoluminescent structure;
wherein the first photoluminescent layer comprises a first polymer matrix material and a first photoluminescent material dispersed within the first polymer matrix material; the second photoluminescent layer comprises a second polymer matrix material and a second photoluminescent material dispersed within the second polymer matrix material; the first photoluminescent material is less moisture sensitive than the second photoluminescent material; and the encapsulation structure comprises a substantially transparent polymer material,
wherein the photoluminescent structure further comprises a third photoluminescent layer comprising a fifth polymer matrix material and a third photoluminescent material dispersed within the fifth polymer matrix material, the third photoluminescent material is different from the second photoluminescent material, and the second photoluminescent layer is disposed between the first photoluminescent layer and the third photoluminescent layer.

24. The light-emitting device according to claim 23, wherein the extension portion of the second photoluminescent layer comprises an edge surface, which is covered and encapsulated by the first photoluminescent layer.

25. The light-emitting device according to claim 23, wherein a weight percentage of the first photoluminescent material to the first photoluminescent layer or a weight percentage of the third photoluminescent material to the third photoluminescent layer is not less than 50%.

26. A light-emitting device comprising:
a light-emitting semiconductor die;
a packaging structure including a lead frame, which comprises a first electrode and a second electrode, and a reflector disposed on the lead frame; wherein the first electrode and the second electrode are partially exposed for electrical connection, and an optical cavity is formed by the lead frame and the reflector; and
a photoluminescent structure disposed inside the optical cavity to cover the light-emitting semiconductor die and comprising a second photoluminescent layer and a first photoluminescent layer disposed on the second photoluminescent layer; wherein the first photoluminescent layer comprises a first polymer matrix material and a first photoluminescent material dispersed within the first polymer matrix material, and the second photoluminescent layer comprises a second polymer matrix material and a second photoluminescent material dispersed within the second polymer matrix material;
wherein the light-emitting semiconductor die is disposed and mechanically bonded inside the optical cavity of the packaging structure and is electrically connected to the first electrode and the second electrode of the lead frame.

27. The light-emitting device according to claim 26, wherein a weight percentage of the first photoluminescent material to the first photoluminescent layer is not less than 50%.

28. The light-emitting device according to claim 26, wherein a medium particle size of the first photoluminescent material is not more than 30 μm.

29. The light-emitting device according to claim 26, wherein the packaging structure further comprises a substantially transparent polymer material disposed between the light-emitting semiconductor die and the photoluminescent structure to form a spacer so that the photoluminescent structure is not in direct contact with the light-emitting semiconductor die.

30. The light-emitting device according to claim 26, further comprising a substantially transparent moisture barrier layer disposed on the photoluminescent structure.

31. The light-emitting device according to claim 26, wherein at least one of the photoluminescent structure or the packaging structure further comprises a getter material.

32. A light-emitting device comprising:
a light-emitting semiconductor die comprising an upper surface, an edge surface, a lower surface, and a set of electrodes disposed adjacent to the lower surface;
a photoluminescent structure comprising an upper surface, an edge surface and a lower surface disposed on the light-emitting semiconductor die, and further comprising a first photoluminescent layer and a second photoluminescent layer disposed on the first photoluminescent layer, wherein the first photoluminescent layer comprises a first polymer matrix material and a less-moisture-sensitive photoluminescent material dispersed within the first polymer matrix material, and the second photoluminescent layer comprises a second polymer matrix material and a moisture-sensitive photoluminescent material dispersed within the second polymer matrix material;
a reflective structure surrounding and covering the edge surface of the light-emitting semiconductor die and the edge surface of the photoluminescent structure, wherein the reflective structure comprises a third polymer matrix material and light scattering particles dispersed within the third polymer matrix material; and
a substantially transparent moisture barrier layer disposed covering the photoluminescent structure.

33. The light-emitting device according to claim 32, wherein a surface area of the first photoluminescent layer is larger than a surface area of the second photoluminescent layer, and the second photoluminescent layer comprises a bottom surface and an edge surface, which are covered and encapsulated by the first photoluminescent layer.

* * * * *